United States Patent
Kikuchi et al.

(10) Patent No.: US 11,889,732 B2
(45) Date of Patent: Jan. 30, 2024

(54) DISPLAY DEVICE WITH SURFACE MOUNT DEVICES THAT INCLUDE PIXELS

(71) Applicant: SONY SEMICONDUCTOR SOLUTIONS CORPORATION, Kanagawa (JP)

(72) Inventors: Norifumi Kikuchi, Kanagawa (JP); Hisao Sakurai, Kanagawa (JP); Ippei Nishinaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/911,615

(22) PCT Filed: Mar. 31, 2021

(86) PCT No.: PCT/JP2021/013943
§ 371 (c)(1),
(2) Date: Sep. 14, 2022

(87) PCT Pub. No.: WO2021/201139
PCT Pub. Date: Oct. 7, 2021

(65) Prior Publication Data
US 2023/0124835 A1    Apr. 20, 2023

(30) Foreign Application Priority Data

Mar. 31, 2020   (JP) ................................. 2020-064477

(51) Int. Cl.
*G09G 3/32* (2016.01)
*H10K 59/35* (2023.01)
(Continued)

(52) U.S. Cl.
CPC ......... *H10K 59/351* (2023.02); *G09G 3/2003* (2013.01); *G09G 3/32* (2013.01);
(Continued)

(58) Field of Classification Search
CPC .............. H10K 59/351; H10K 59/38; H10K 2102/301; G09G 3/2003; G09G 3/32;
(Continued)

(56) References Cited

U.S. PATENT DOCUMENTS

| 2011/0199474 A1* | 8/2011 | Wang ............ H05B 45/30 307/66 |
| 2012/0175650 A1* | 7/2012 | Tomiyoshi ....... G02F 1/133603 257/89 |

(Continued)

FOREIGN PATENT DOCUMENTS

| CN | 103366683 | 10/2013 |
| CN | 103474001 | 12/2013 |

(Continued)

OTHER PUBLICATIONS

International Search Report and Written Opinion prepared by the Japan Patent Office dated Jun. 16, 2021, for International Application No. PCT/JP2021/013943, 3 pgs.

*Primary Examiner* — Pegeman Karimi
(74) *Attorney, Agent, or Firm* — Sheridan Ross PC

(57) ABSTRACT

A display device includes a plurality of first pixels each including a first light emitting diode element and a second light emitting diode element having different colors, and a plurality of second pixels each including a third light emitting diode element and a fourth light emitting diode element having different colors. The first pixel and the second pixel have different combinations of colors of light emitting diode elements, the first light emitting diode element is a green light emitting diode element, and the third light emitting diode element is a green light emitting diode element, a yellow light emitting diode element, or a white light emitting diode element. The first pixels and the second pixels are (Continued)

alternately arranged in a first direction and alternately arranged in a second direction intersecting the first direction.

16 Claims, 24 Drawing Sheets

(51) Int. Cl.
*H10K 59/38* (2023.01)
*G09G 3/20* (2006.01)
*H10K 102/00* (2023.01)

(52) U.S. Cl.
CPC ..... *H10K 59/38* (2023.02); *G09G 2300/0452* (2013.01); *H10K 2102/301* (2023.02)

(58) Field of Classification Search
CPC .... G09G 2300/0452; G09G 3/30; G09G 3/20; G09G 3/34; H01L 25/0753; H01L 27/156; H01L 33/502; H01L 33/52; G09F 9/302; G09F 9/33
See application file for complete search history.

(56) References Cited

U.S. PATENT DOCUMENTS

| | | | |
|---|---|---|---|
| 2015/0015466 | A1 | 1/2015 | Feng |
| 2015/0201479 | A1* | 7/2015 | Braunstein ............. H05B 45/20 315/152 |
| 2016/0240593 | A1* | 8/2016 | Gu ....................... G09G 3/3225 |
| 2017/0084671 | A1 | 3/2017 | Hack et al. |
| 2017/0278904 | A1 | 9/2017 | Park |
| 2018/0069059 | A1 | 3/2018 | Hack et al. |
| 2018/0166512 | A1* | 6/2018 | Hack ..................... H10K 59/00 |
| 2019/0081113 | A1 | 3/2019 | Gu et al. |
| 2020/0402440 | A1* | 12/2020 | Takasugi .............. G09G 3/2003 |
| 2021/0383767 | A1* | 12/2021 | Tomizawa ........... G09G 3/3607 |
| 2023/0076449 | A1* | 3/2023 | Luty ..................... H05K 3/284 |

FOREIGN PATENT DOCUMENTS

| | | |
|---|---|---|
| CN | 104885141 | 9/2015 |
| CN | 105989793 | 10/2016 |
| CN | 106549034 | 3/2017 |
| CN | 108492723 | 9/2018 |
| CN | 208753326 | 4/2019 |
| CN | 110620135 A | 12/2019 |
| JP | 2001-075508 | 3/2001 |
| JP | 2006-292858 | 10/2006 |
| JP | 2012-212152 | 11/2012 |
| JP | 2015-018242 | 1/2015 |
| JP | 2016-537688 | 12/2016 |
| KR | 10-2015-0007992 | 1/2015 |
| KR | 10-2017-0034307 | 3/2017 |
| TW | 201503343 | 1/2015 |
| WO | WO 2015/062110 | 5/2015 |
| WO | WO-2019216196 A1 | 11/2019 |
| WO | WO 2020/093948 | 5/2020 |

* cited by examiner

DISPLAY DEVICE WITH SURFACE MOUNT DEVICES THAT INCLUDE PIXELS

CROSS REFERENCE TO RELATED APPLICATIONS

This application is a national stage application under 35 U.S.C. 371 and claims the benefit of PCT Application No. PCT/JP2021/013943, having an international filing date of 31 Mar. 2021, which designated the United States, which PCT application claimed the benefit of Japanese Patent Application No. 2020-064477, filed 31 Mar. 2020, the entire disclosures of each of which are incorporated herein by reference.

TECHNICAL FIELD

The present disclosure relates to a display device.

BACKGROUND ART

In recent years, an LED display device in which a plurality of light emitting diode elements (hereinafter referred to as "LED elements") is two-dimensionally arranged has been widely known. In an LED display device, one pixel includes LEDs of three colors of red (R), green (G), and blue (B) (see Patent Document 1, for example).

CITATION LIST

Patent Document

Patent Document 1

Japanese Patent Application Laid-Open No. 2001-75508

SUMMARY OF THE INVENTION

Problems to be Solved by the Invention

However, in the LED display device described above, since LED elements of three colors of R, G, and B are used, there is a problem that the number of wirings on the substrate increases. In particular, in a high-resolution LED display device, since the number of LED elements increases, the problem of the number of wires becomes significant.

An object of the present disclosure is to provide a display device capable of reducing the number of wirings on a substrate and simplifying manufacturing by changing the pixel configuration.

Solutions to Problems

In order to solve the above-described problem, a first disclosure provides a display device including:
a plurality of first pixels each having a first light emitting diode element and a second light emitting diode element having different colors; and
a plurality of second pixels each having a third light emitting diode element and a fourth light emitting diode element having different colors,
in which the first pixels and the second pixels have different combinations of colors of light emitting diode elements,
the first light emitting diode element is a green light emitting diode element,
the third light emitting diode element is a green light emitting diode element, a yellow light emitting diode element, or a white light emitting diode element, and
the first pixels and the second pixels are alternately arranged in a first direction and are alternately arranged in a second direction intersecting the first direction.

According to a second disclosure, there is provided a display device including:
a plurality of first pixels each having a green light emitting diode element and a red light emitting diode element;
a plurality of second pixels each having a green light emitting diode element; and
a blue light emitting diode element,
in which the first pixels and the second pixels are arranged in a lattice shape so as to be alternately arranged in a first direction and alternately arranged in a second direction intersecting the first direction, and
the blue light emitting diode element is arranged in a central part of a basic lattice in the arrangement in a lattice shape.

According to a third disclosure, there is provided a display device including:
a first pixel including a first light emitting unit and a second light emitting unit having different colors; and
a second pixel including a third light emitting unit and a fourth light emitting unit having different colors,
in which the first pixel and the second pixel have different combinations of colors of light emitting units,
the first light emitting unit is a green light emitting unit including a white light emitting diode and a green filter,
the third light emitting unit is a green light emitting unit including a white light emitting diode and a green filter, a yellow light emitting unit including a white light emitting diode and a yellow filter, or a white light emitting unit including a white light emitting diode, and
the first pixel and the second pixel are alternately arranged in a first direction and are alternately arranged in a second direction intersecting the first direction.

According to a fourth disclosure, there is provided a display device including:
a plurality of first pixels each including a green light emitting unit and a red light emitting unit;
a plurality of second pixels each including a green light emitting unit; and
a blue light emitting unit,
wherein the green light emitting unit included in the first pixel and the green light emitting unit included in the second pixel include a white light emitting diode and a green filter,
the red light emitting unit includes a white light emitting diode and a red filter,
the blue light emitting unit includes a white light emitting diode and a blue filter,
the first pixels and the second pixels are arranged in a lattice shape so as to be alternately arranged in a first direction and alternately arranged in a second direction intersecting the first direction, and
the blue light emitting unit is arranged in a central part of a basic lattice in the arrangement in a lattice shape.

MODE FOR CARRYING OUT THE INVENTION

Figure 1:
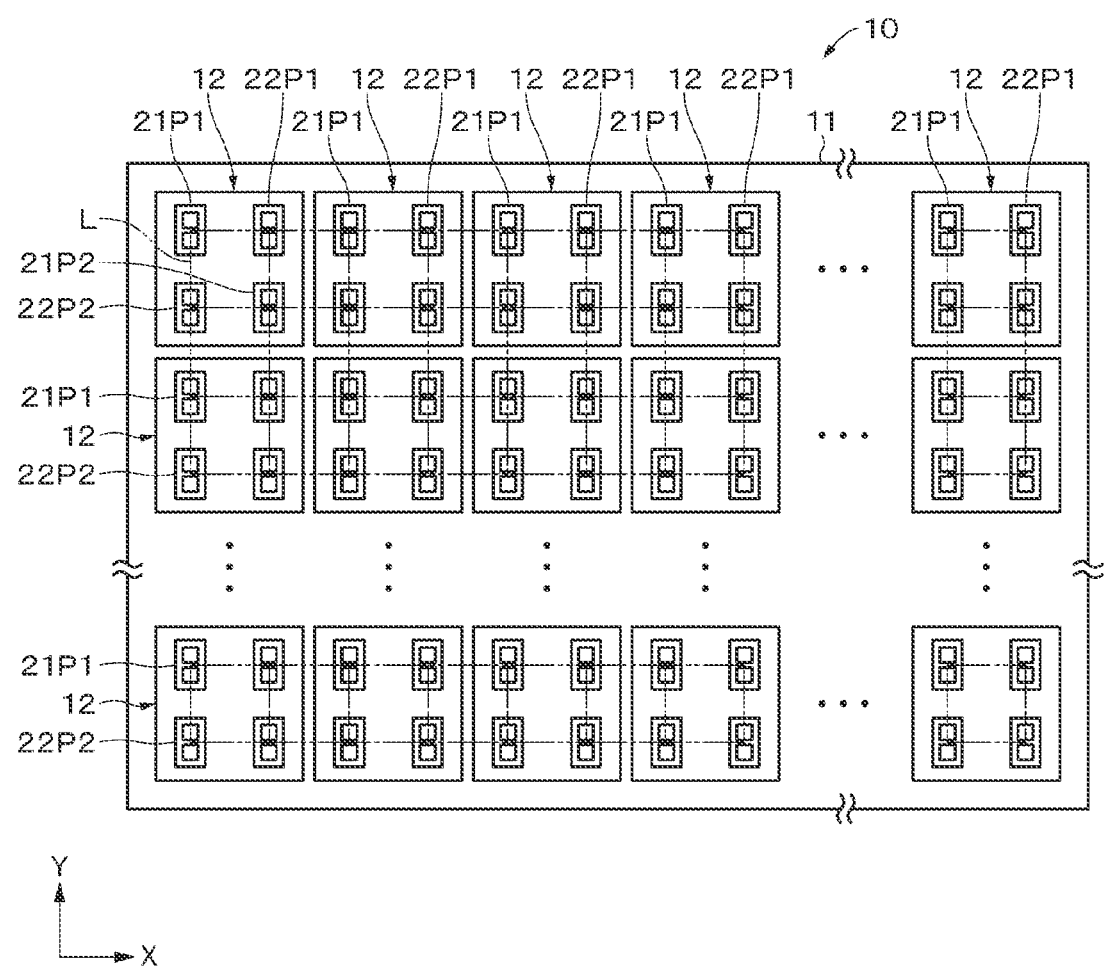
FIG. 1 is a plan view of a display device according to a first embodiment of the present disclosure.

Embodiments of the present disclosure will be described in the following order. Note that in all the drawings of the following embodiments, the same or corresponding parts are denoted by the same reference numerals.

1 First embodiment (example of display device in which plurality of surface mount devices having four pixels is arranged)
2 Second embodiment (example of display device in which plurality of surface mount devices having one pixel is arranged)
3 Third embodiment (example of display device in which plurality of surface mount devices having LED element in central part is arranged)

1. First Embodiment

Overview

Since the human eye has low resolution and recognition for the color blue (less M cones), the sense of resolution is not largely affected even if blue LED elements are thinned out from pixels having LED elements of three colors of red, green, and blue. Furthermore, since the resolution and recognition for the color red is less visible than the color green, the sense of resolution is not largely affected even if red LED elements are thinned out from pixels having LED elements of three colors.

In the display device according to the first embodiment, a plurality of first pixels having LED elements of two colors of red and green and a plurality of second pixels having LED elements of two colors of green and blue are two-dimensionally arranged on the basis of the above viewpoint.

Configuration of Display Device

FIG. 1 is a plan view of a display device 10 according to a first embodiment of the present disclosure. The display device 10 is a so-called LED display device, and includes a substrate 11 and a plurality of surface mount devices (hereinafter referred to as "SMDs") 12 provided on the substrate 11.

Substrate

The substrate 11 is, for example, a printed circuit board (PCB). A plurality of scanning lines, a plurality of signal lines, and driver integrated circuits (IC) for controlling the plurality of SMDs 12 via the plurality of scanning lines and the plurality of signal lines are provided on the substrate 11.

SMD

The plurality of SMDs 12 is two-dimensionally arranged in a lattice shape on the substrate 11. In the following description, a row direction of the two-dimensional arrangement is referred to as an X-axis direction (first direction), and a column direction orthogonal to and intersecting the row direction is referred to as a Y-axis direction (second direction). The SMD 12 is an SMD (4 in 1 SMD) in which four pixels are integrated into one chip.

Figure 2A:
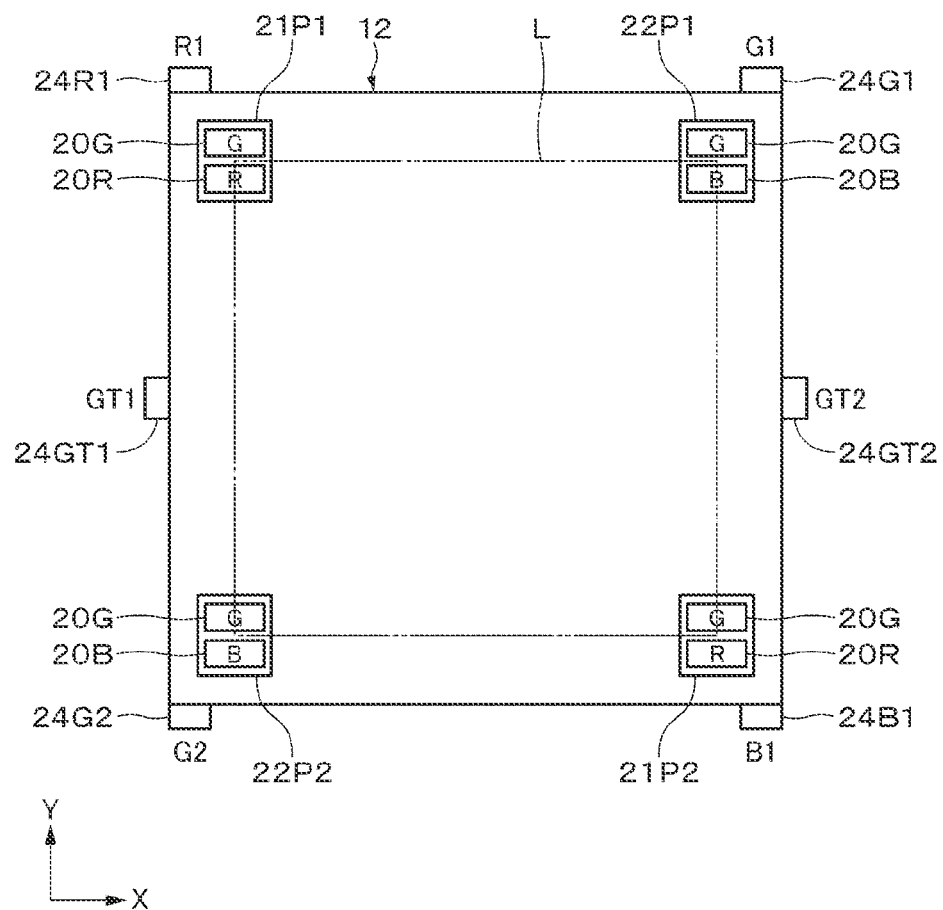
FIG. 2A is a plan view of a surface mount device.
Figure 2B:
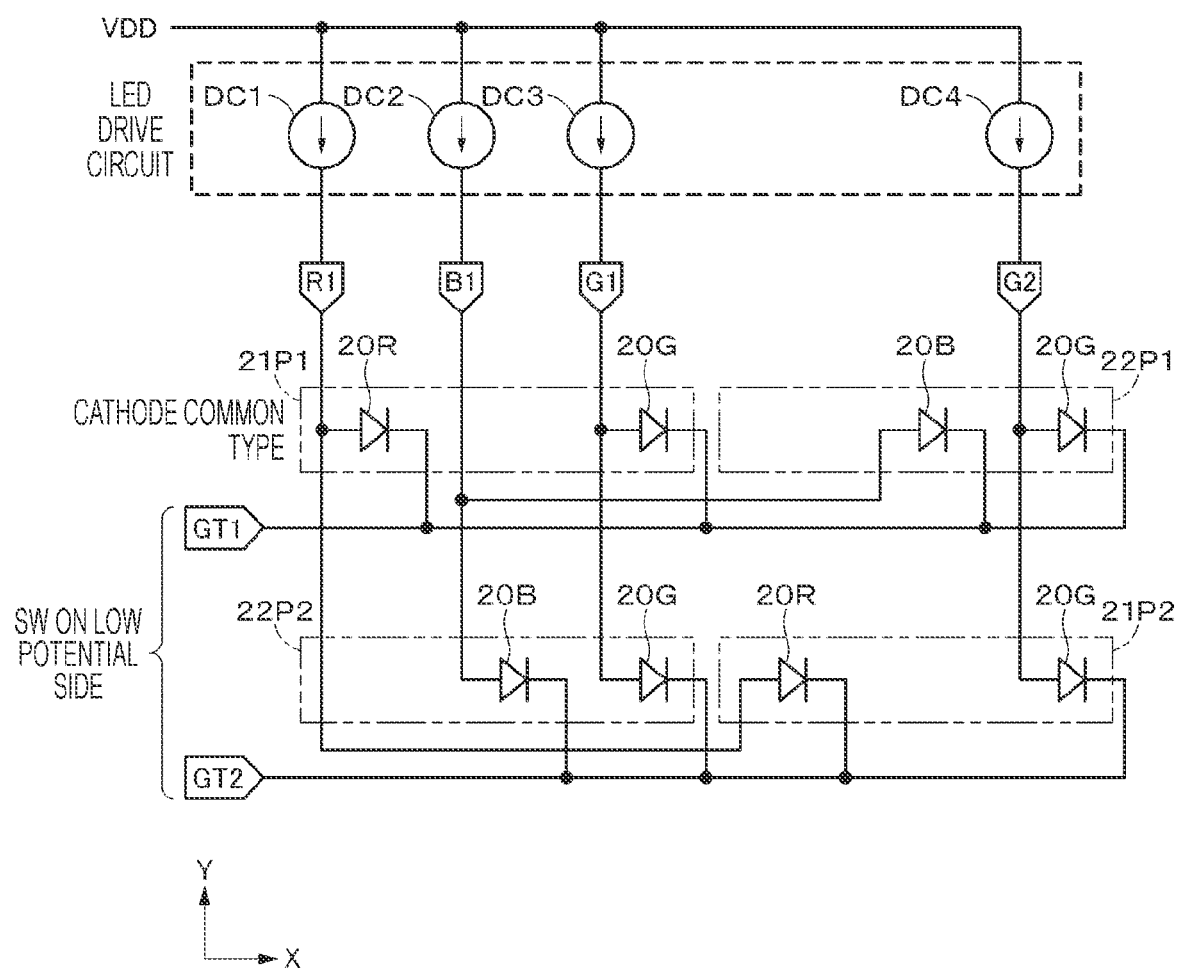
FIG. 2B is a circuit diagram of the surface mount device.

FIG. 2A is a plan view of the SMD 12. FIG. 2B is a circuit diagram of the SMD 12. The SMD 12 includes a pixel (first pixel) 21P1, a pixel (first pixel) 21P2, a pixel (second pixel) 22P1, and a pixel (second pixel) 22P2. The pixel 21P1 and the pixel 21P2 have the same combination of colors of light emitting diode elements. The pixel 22P1 and the pixel 22P2 have the same combination of colors of light emitting diode elements. The pixels 21P1 and 21P2 and the pixels 22P1 and 22P2 have different combinations of colors of light emitting diode elements. In the following description, in a case where the pixel 21P1 and the pixel 21P2 are not particularly distinguished, the pixel 21P1 and the pixel 21P2 may be referred to as a pixel 21P. Furthermore, in a case where the pixel 22P1 and the pixel 22P2 are not particularly distinguished, the pixel 22P1 and the pixel 22P2 may be referred to as a pixel 22P.

The pixel 21P1 and the pixel 21P2 include a green LED element (first LED element) 20G and a red LED element (second LED element) 20R as a set of LED elements having different colors. The pixel 22P1 and the pixel 22P2 include a green LED element (third LED element) 20G and a blue LED element (fourth LED element) 20B as a set of LED elements having different colors.

The pixels 21P and the pixels 22P are two-dimensionally arranged in a lattice shape (matrix shape) so as to be alternately arranged in the X-axis direction and alternately arranged in the Y-axis direction orthogonal to and intersecting the X-axis direction. That is, the pixels 21P and the pixels 22P are two-dimensionally arranged in a staggered manner. While FIGS. 1 and 2A illustrate an example in which a basic lattice L in the arrangement in a lattice shape is a square, the shape of the basic lattice L is not limited thereto, and may be a quadrangle such as a rectangle, a rhombus, or a parallelogram. The SMD 12 includes one basic lattice L.

The SMD 12 is of a cathode common type in which the cathode is a common terminal. The SMD 12 includes cathode terminals (gate terminals) 24GT1 and 24GT2 which are common terminals, an anode terminal 24R1, anode terminals 24G1 and 24G2, and an anode terminal 24B1.

The cathodes of the green LED element 20G and the red LED element 20R included in the pixel 21P1 and the cathodes of the green LED element 20G and the blue LED element 20B included in the pixel 22P1 are connected to a scanning line GT1 via the common cathode terminal 24GT1. The cathodes of the green LED element 20G and the red LED element 20R included in the pixel 21P2 and the cathodes of the green LED element 20G and the blue LED element 20B included in the pixel 22P2 are connected to a scanning line GT2 via the common cathode terminal 24GT2.

The anode of the green LED element 20G included in the pixel 21P1 and the anode of the green LED element 20G included in the pixel 22P2 are connected to a signal line G1 via the anode terminal 24G1. The anode of the green LED element 20G included in the pixel 21P2 and the anode of the green LED element 20G included in the pixel 22P1 are connected to a signal line G2 via the anode terminal 24G2.

The anode of the red LED element 20R included in the pixel 21P1 and the anode of the red LED element 20R included in the pixel 21P2 are connected to a signal line R1 via the anode terminal 24R1.

The anode of the blue LED element 20B included in the pixel 22P1 and the anode of the blue LED element 20B included in the pixel 22P2 are connected to a signal line B1 via the anode terminal 24B1.

The scanning lines GT1 and GT2 are connected to gates (not illustrated) as switches. The signal lines R1, B1, G1, and G2 are connected to DC sources DC1, DC2, DC3, and DC4, respectively. In the cathode common type SMD 12, a current flows from the driver into each of the LED elements 20R, 20G, and 20B.

Operation and Effect

As described above, the display device 10 according to the first embodiment includes the plurality of pixels 21P including the green LED element 20G and the red LED element 20R, and the plurality of pixels 22P including the green LED element 20G and the blue LED element 20B. The pixels 21P and the pixels 22P are alternately arranged in the X-axis direction and alternately arranged in the Y-axis direction orthogonal to and intersecting the X-axis direction.

With the above configuration, in the display device 10, since the number of LED elements can be reduced, the number of components of the display device 10 can be reduced. Hence, the reliability of the display device 10 can be improved. Furthermore, manufacturing can be simplified by changing the pixel configuration.

Furthermore, in the display device 10, since the number of driving wirings can be reduced, the wiring rule of the substrate 11 can be relaxed, and the number of driver ICs can be reduced.

Furthermore, since the number of components and the driver ICs can be reduced as described above, the cost of the display device 10 can be reduced.

Furthermore, by reducing the number of driver ICs described above, the amount of heat generation (i.e., power consumption) of the display device 10 can be reduced, and the luminance of the display device 10 can be improved.

Since the pixels 21P1 and 21P2 are formed by thinning out the blue LED element 20B from the pixel having the LED elements 20R, 20G, and 20B of three colors, and the pixels 22P1 and 22P2 are formed by thinning out the red LED element 20R from the pixel having the LED elements 20R, 20G, and 20B of three colors, the total signal amount can be reduced to ⅔. This is equivalent to Y chrominance conversion of a video signal (RGB). Furthermore, since video signal transmission, signal processing, and the like can also be reduced to ⅔, the cost of the circuit can be reduced. Moreover, it is also possible to extend the signal transmission distance between the controller and the display unit, since a reduction in the total amount of signals can curb deterioration in signal quality.

Since both the pixel 21P and the pixel 22P have the green LED element 20G having high visibility, it is possible to curb degradation in the sense of resolution (image quality) even in a screen formed by two-dimensionally arranging a plurality of pixels 21P having only the LED elements 20G and 20R of two colors and a plurality of pixels 22P having only the LED elements 20G and 20B of two colors.

Figure 3A:
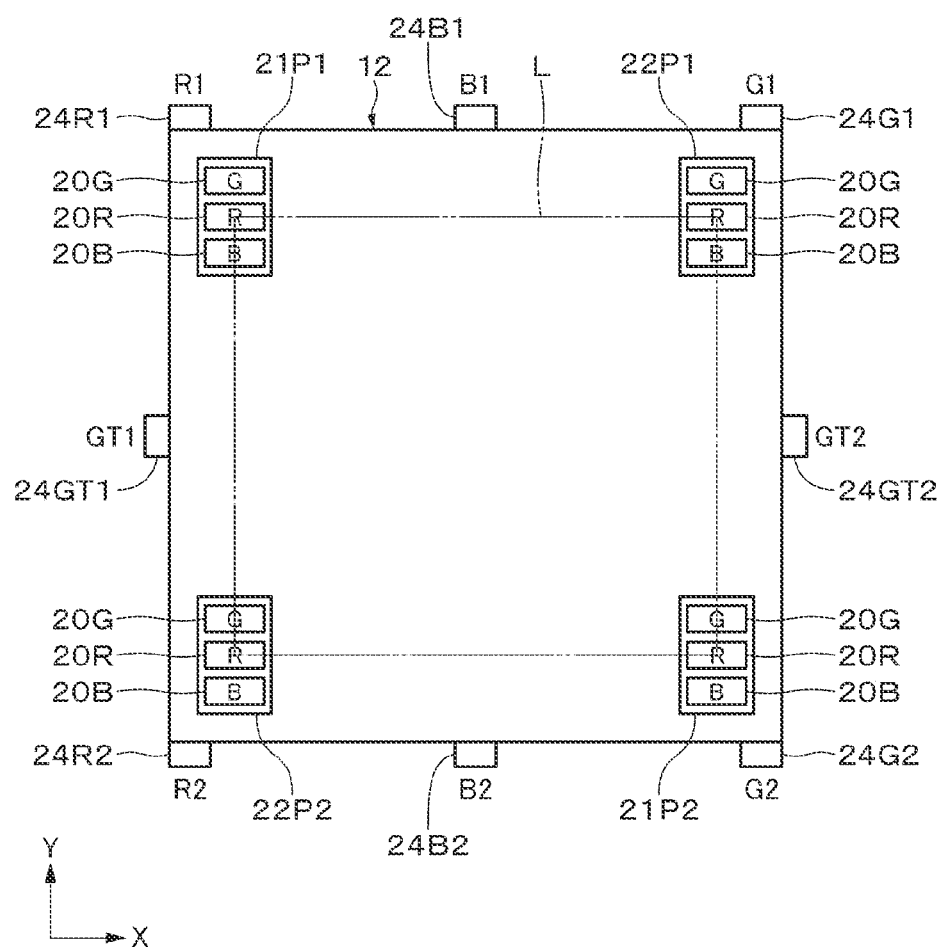
FIG. 3A is a plan view of a surface mount device of a comparative example.
Figure 3B:
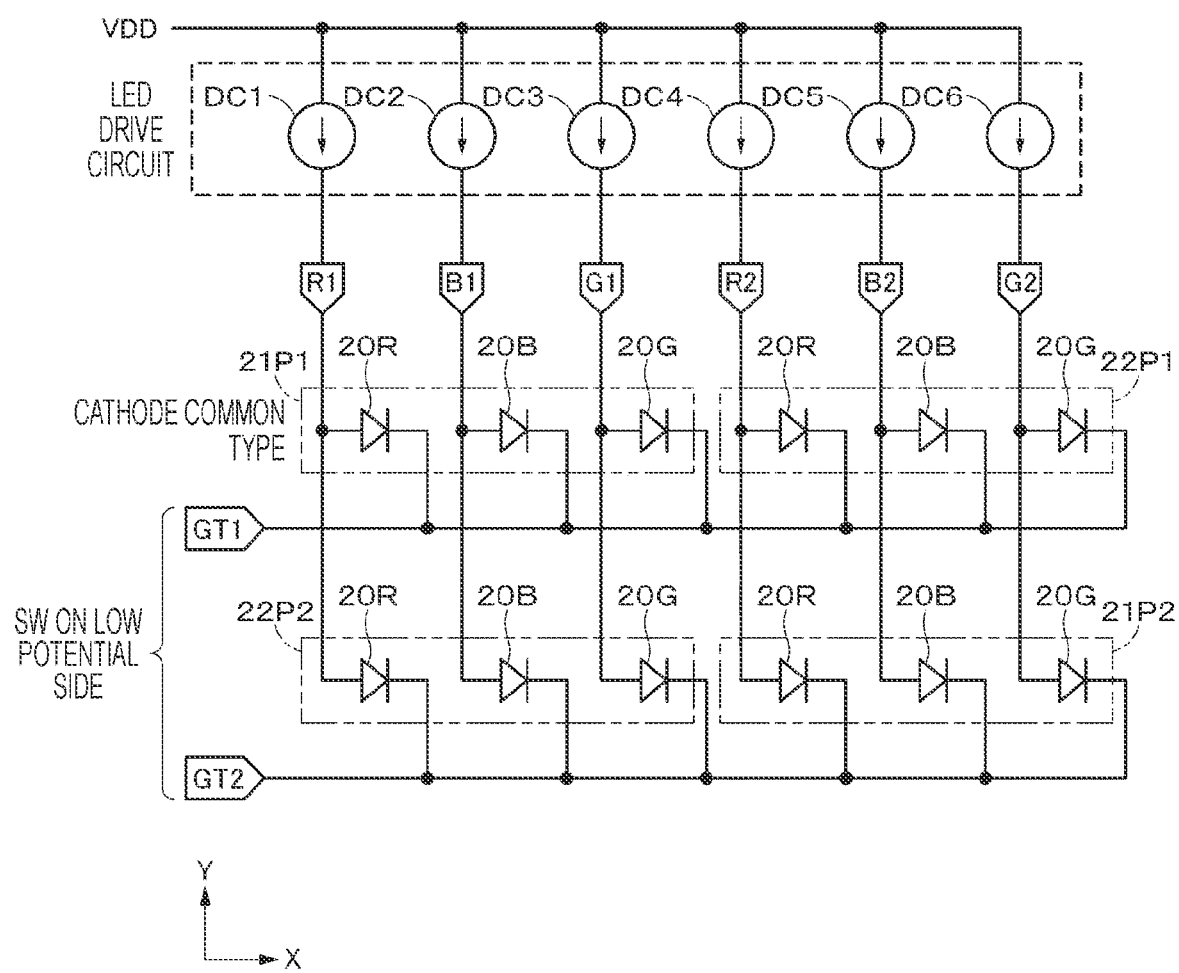
FIG. 3B is a circuit diagram of the surface mount device.

FIG. 3A is a plan view of an SMD 32 of a comparative example. FIG. 3B is a circuit diagram of the SMD 32 of the comparative example. As illustrated in FIG. 3A, each of pixels 21P1, 21P2, 22P1, and 22P2 of the SMD 32 includes three LED elements 20R, 20G, and 20B of red, green, and blue. Therefore, as illustrated in FIG. 3B, the number of driving wirings is large, and the wiring rule of the substrate becomes complicated. Hence, the number of driver ICs increases.

Modification

Modification 1

Figure 4A:
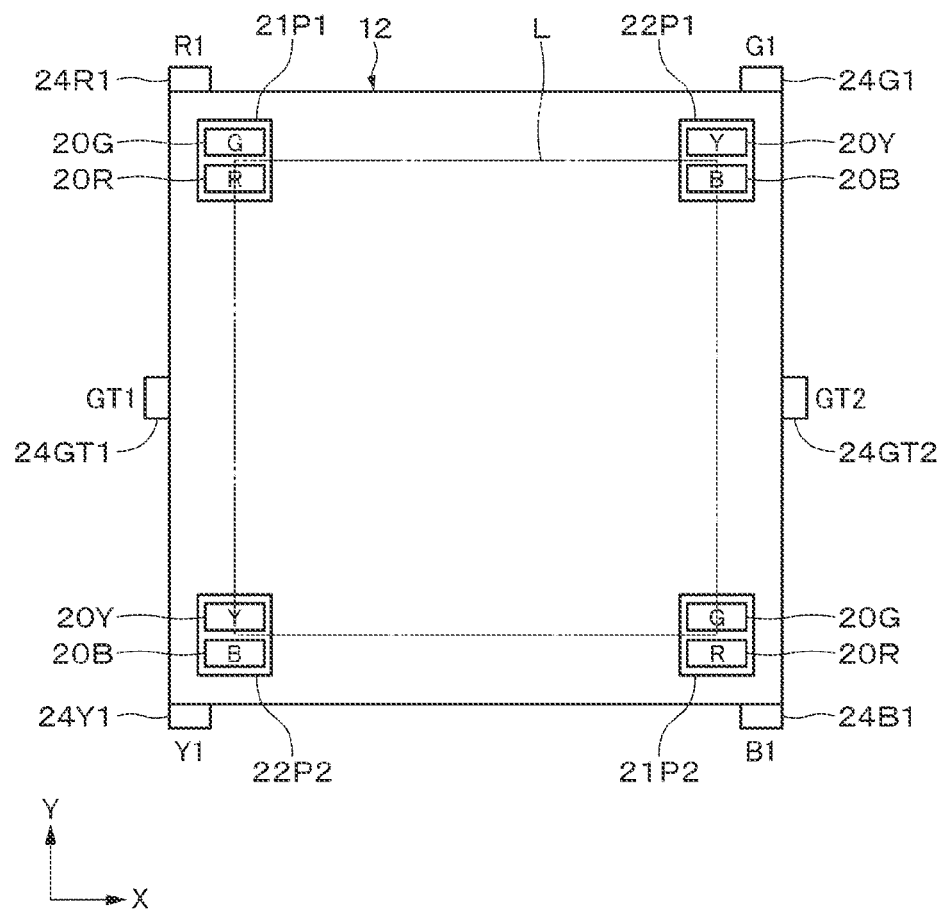
FIG. 4A is a plan view of a surface mount device of a modification.
Figure 4B:
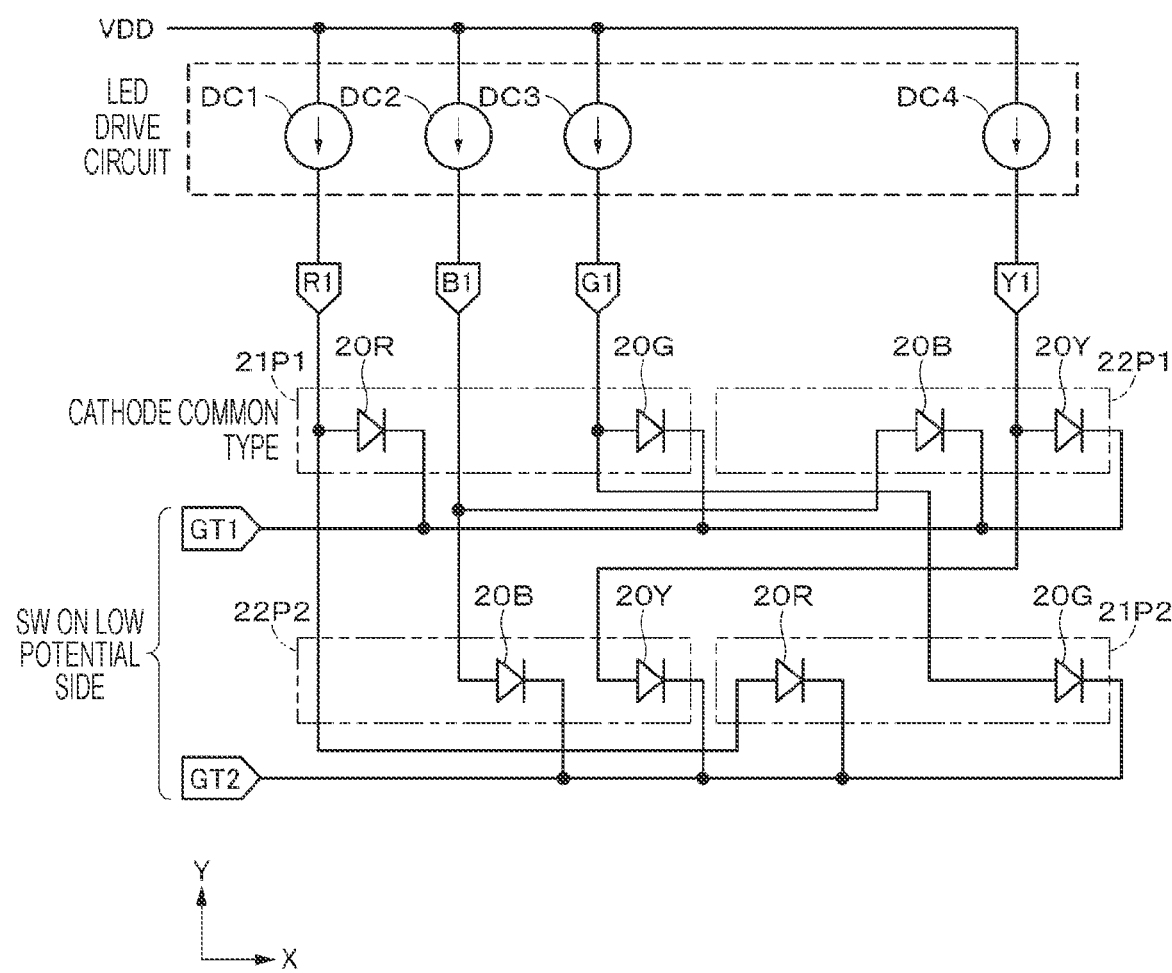
FIG. 4B is a circuit diagram of the surface mount device of the modification.

As illustrated in FIGS. 4A and 4B, each of pixels 22P1 and 22P2 may include a yellow LED element (third LED element) 20Y instead of the green LED element (third LED element) 20G (see FIGS. 2A and 2B). That is, each of the pixels 22P1 and 22P2 may include the yellow LED element 20Y and a blue LED element 20B.

In the case of the pixel configuration described above, an SMD 12 includes an anode terminal 24Y1 instead of the anode terminal 24G2 (see FIG. 2A). The anode of the yellow LED element 20Y included in the pixel 22P1 is connected to a signal line Y1 via an anode terminal 24Y1, and the cathode of the yellow LED element 20Y is connected to a scanning line GT1 via a cathode terminal 24GT1. The anode of the yellow LED element 20Y included in the pixel 22P2 is connected to the signal line Y1 via the anode terminal 24Y1, and the cathode of the yellow LED element 20Y is connected to a scanning line GT2 via a cathode terminal 24GT2.

Each of pixels 21P1 and 21P2 has the green LED element 20G having high visibility, and each of the pixels 22P1 and 22P2 has the yellow LED element 20Y having high visibility. As a result, it is possible to curb degradation in the sense of resolution (image quality) even in a screen formed by two-dimensionally arranging the plurality of pixels 21P1 and 21P2 having only the LED elements 20G and 20R of two colors and the plurality of pixels 22P1 and 22P2 having only the LED elements 20Y and 20B of two colors.

Furthermore, since yellow is a mixture of green and red, in a display state with low chroma such as a white display state, the pixels 22P1 and 22P2 emit light close to white, and the sense of resolution is enhanced.

Modification 2

Figure 5A:
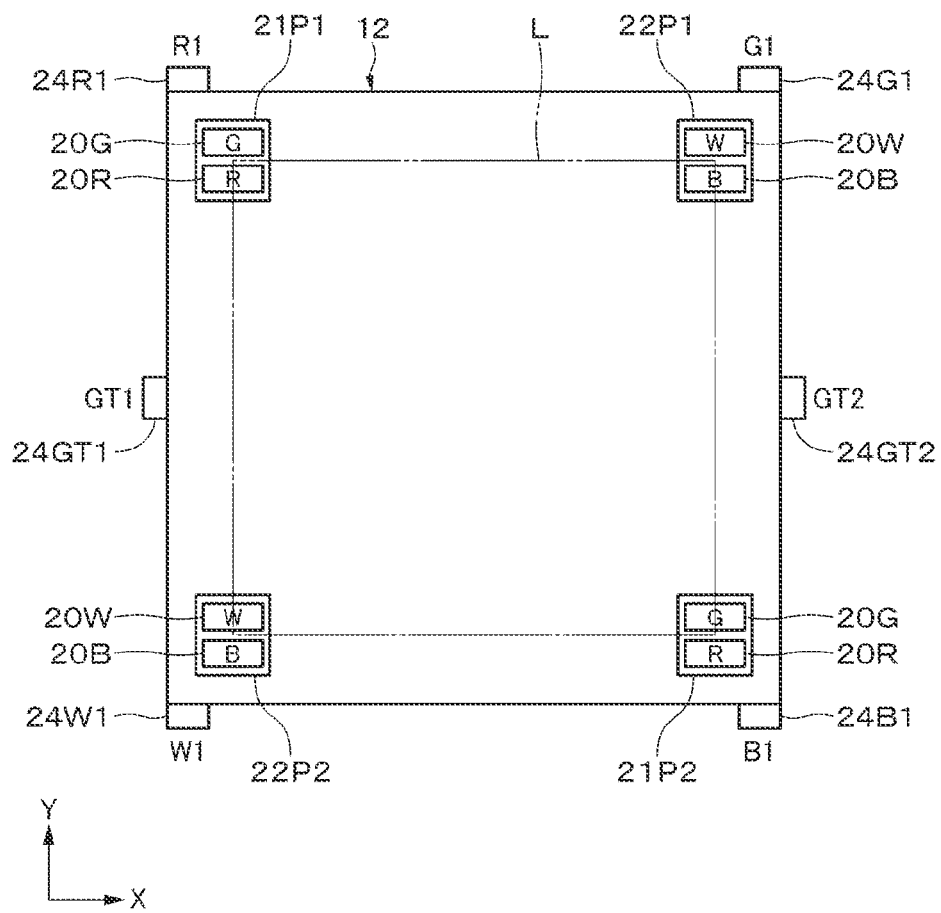
FIG. 5A is a plan view of a surface mount device of a modification.
Figure 5B:
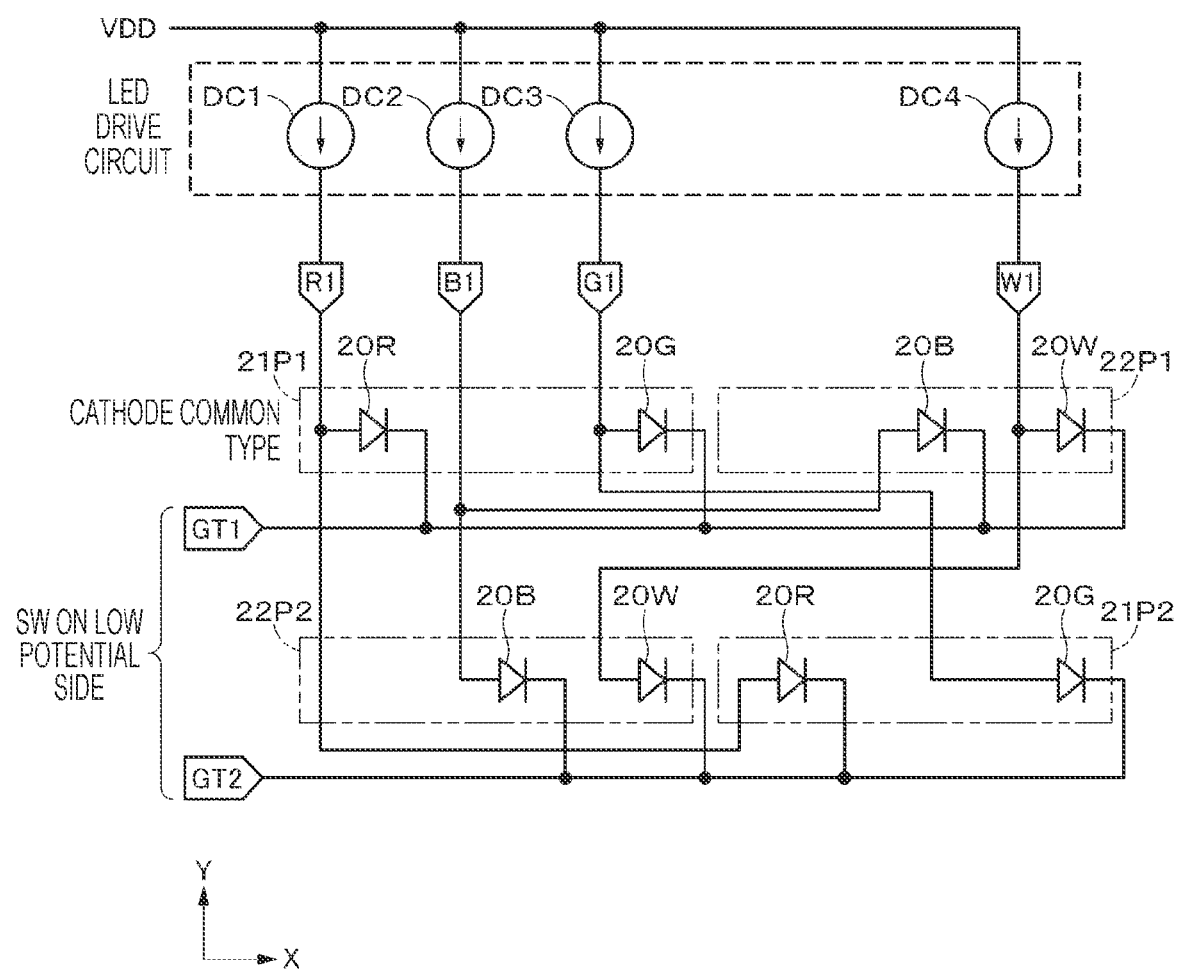
FIG. 5B is a circuit diagram of the surface mount device of the modification.

As illustrated in FIGS. 5A and 5B, each of pixels 22P1 and 22P2 may include a white LED element (third LED element) 20W instead of the green LED element (third LED element) 20G (see FIGS. 2A and 2B). That is, each of the pixels 22P1 and 22P2 may include the white LED element 20W and a blue LED element 20B.

In the case of the pixel configuration described above, an SMD 12 includes an anode terminal 24W1 instead of the anode terminal 24G2 (see FIG. 2A). The anode of the white LED element 20W included in the pixel 22P1 is connected to a signal line W1 via an anode terminal 24W1, and the cathode of the white LED element 20W is connected to a scanning line GT1 via a cathode terminal 24GT1. The anode of the white LED element 20W included in the pixel 22P2 is connected to the signal line W1 via the anode terminal 24W1, and the cathode of the white LED element 20W is connected to a scanning line GT2 via a cathode terminal 24GT2.

The pixels 21P1 and 21P2 have the green LED element 20G having high visibility, and the pixels 22P1 and 22P2 have the white LED element 20W having high visibility. As a result, it is possible to curb degradation in the sense of resolution (image quality) even in a screen formed by two-dimensionally arranging the plurality of pixels 21P1 and 21P2 having only the LED elements 20G and 20R of two colors and the plurality of pixels 22P1 and 22P2 having only the LED elements 20W and 20B of two colors.

Furthermore, since white is a mixture of green, red, and blue, in a display state with low chroma such as a white display state, the pixels 22P1 and 22P2 emit light close to white, and the sense of resolution is enhanced.

Modification 3

Figure 6A:
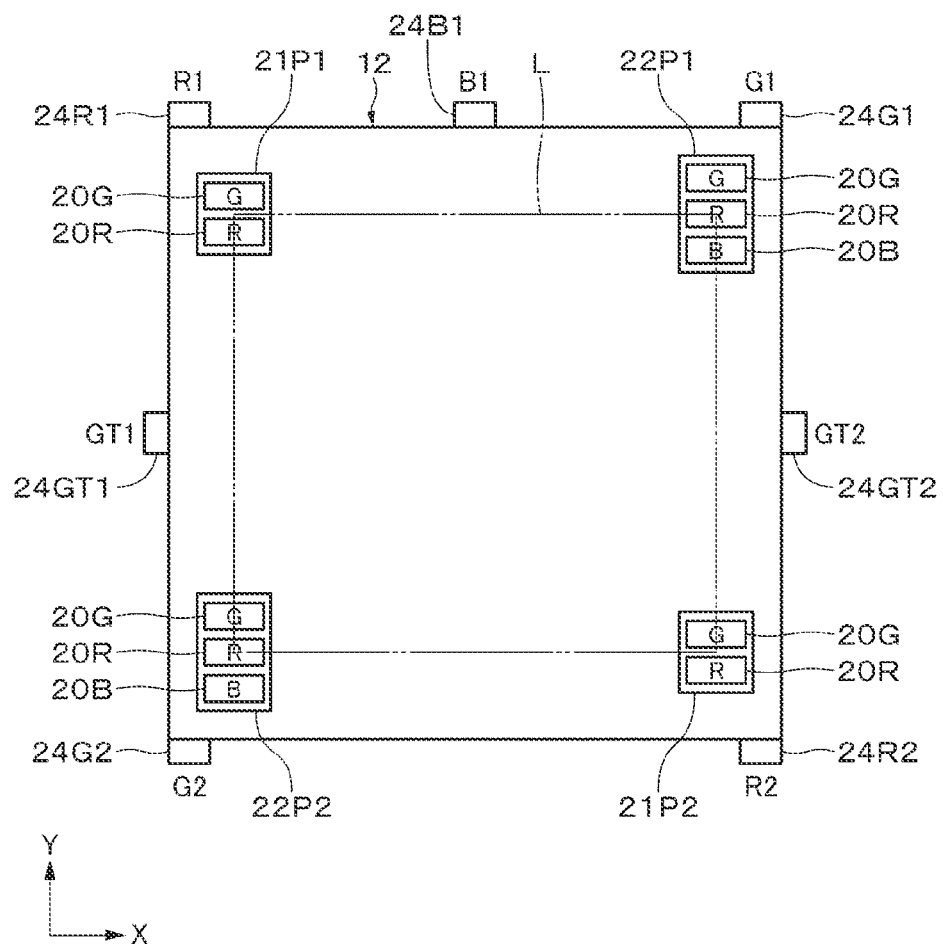
FIG. 6A is a plan view of a surface mount device of a modification.
Figure 6B:
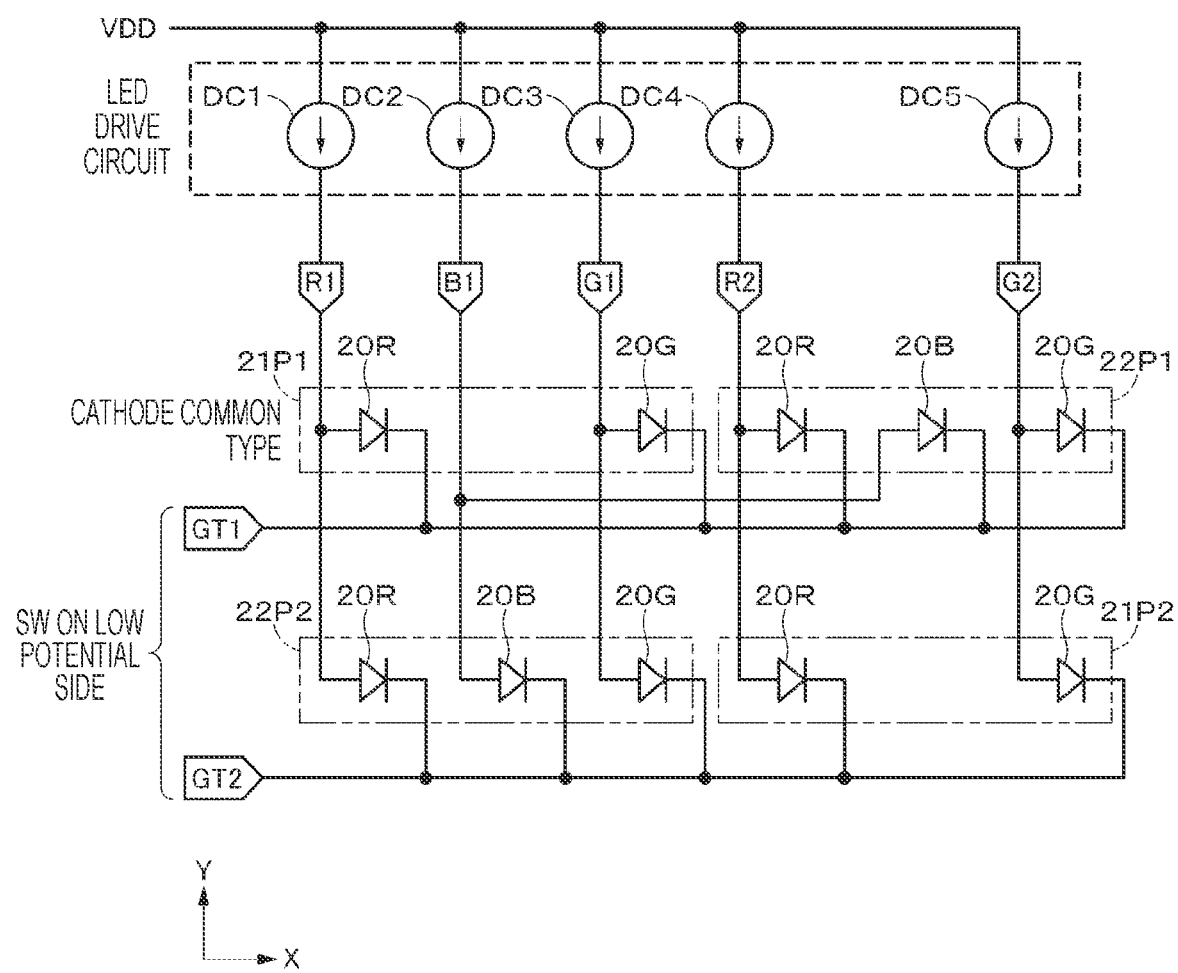
FIG. 6B is a circuit diagram of the surface mount device of the modification.

As illustrated in FIGS. 6A and 6B, each of pixels 22P1 and 22P2 may further include a red LED element (fifth LED element) 20R in addition to the green LED element 20G and the blue LED element 20B (see FIGS. 2A and 2B).

In the case of the above configuration, an SMD 12 further includes an anode terminal 24R2 in addition to cathode terminals 24GT1 and 24GT2, an anode terminal 24R1, anode terminals 24G1 and 24G2, and an anode terminal 24B1 (see FIG. 2A). The anode of the added red LED element 20R included in the pixel 22P1 is connected to a signal line R2 via the anode terminal 24R2, and the cathode of the red LED element 20R is connected to a scanning line GT1 via the cathode terminal 24GT1. The anode of the added red LED element 20R included in the pixel 22P2 is connected to a signal line R1 via the anode terminal 24R1, and the cathode of the red LED element 20R is connected to a scanning line GT2 via the cathode terminal 24GT2. In the first embodiment, the anode of the red LED element 20R included in the pixel 21P2 is connected to the signal line R1 via the anode terminal 24R1. However, in Modification 3, the anode of the red LED element 20R is connected to the signal line R2 via the anode terminal 24R2.

Modification 4

An SMD 12 may have a circuit configuration different from that of Modification 3. For example, as illustrated in FIG. 7B, in the SMD 12, red LED elements 20R included in pixels 21P1 and 22P2 adjacent in the Y-axis direction may be connected in parallel between a signal line R1 and a scanning line GT1. Specifically, the anodes of the red LED elements 20R included in the pixels 21P1 and 22P2 adjacent in the Y-axis direction may both be connected to the signal line R1 via an anode terminal 24R1, and the cathodes of the red LED elements 20R may both be connected to the scanning line GT1 via a cathode terminal 24GT1.

Similarly, the red LED elements 20R included in pixels 22P1 and 21P2 adjacent in the Y-axis direction may be connected in parallel between the signal line R1 and a scanning line GT2. Specifically, the anodes of the red LED elements 20R included in the pixels 22P1 and 21P2 adjacent in the Y-axis direction may both be connected to the signal line R1 via the anode terminal 24R1, and the cathodes of the red LED elements 20R may both be connected to the scanning line GT2 via a cathode terminal 24GT2.

Figure 7A:
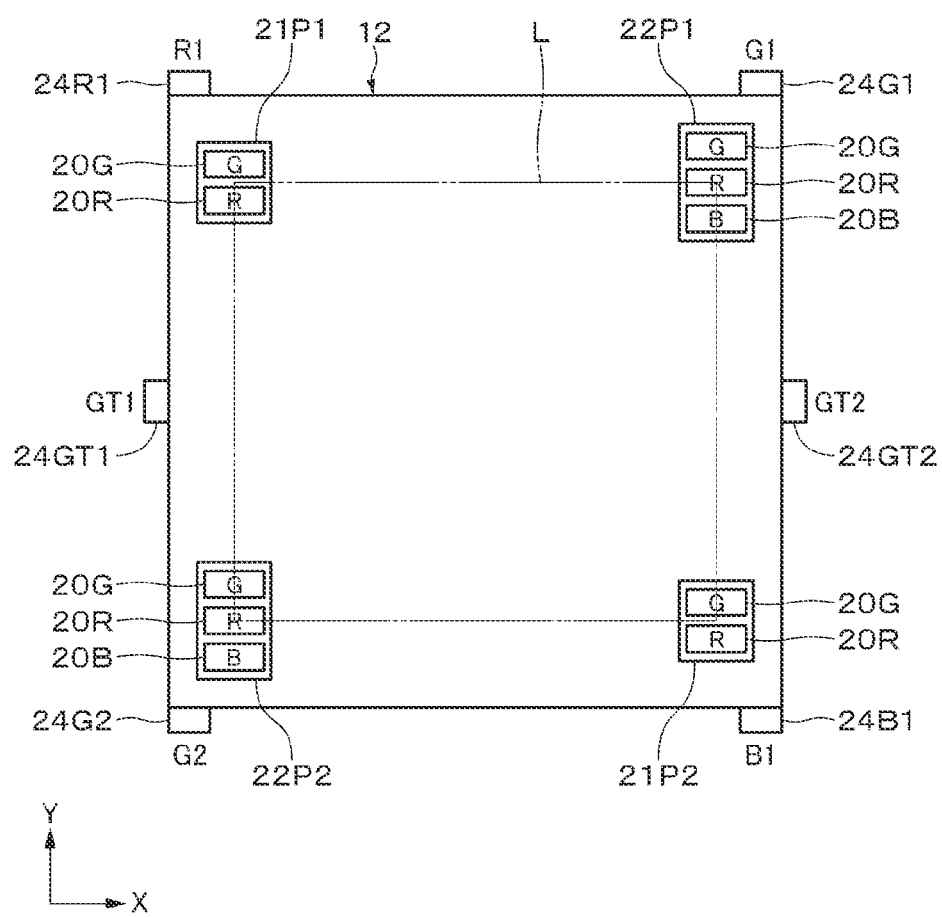
FIG. 7A is a plan view of a surface mount device of a modification.
Figure 7B:
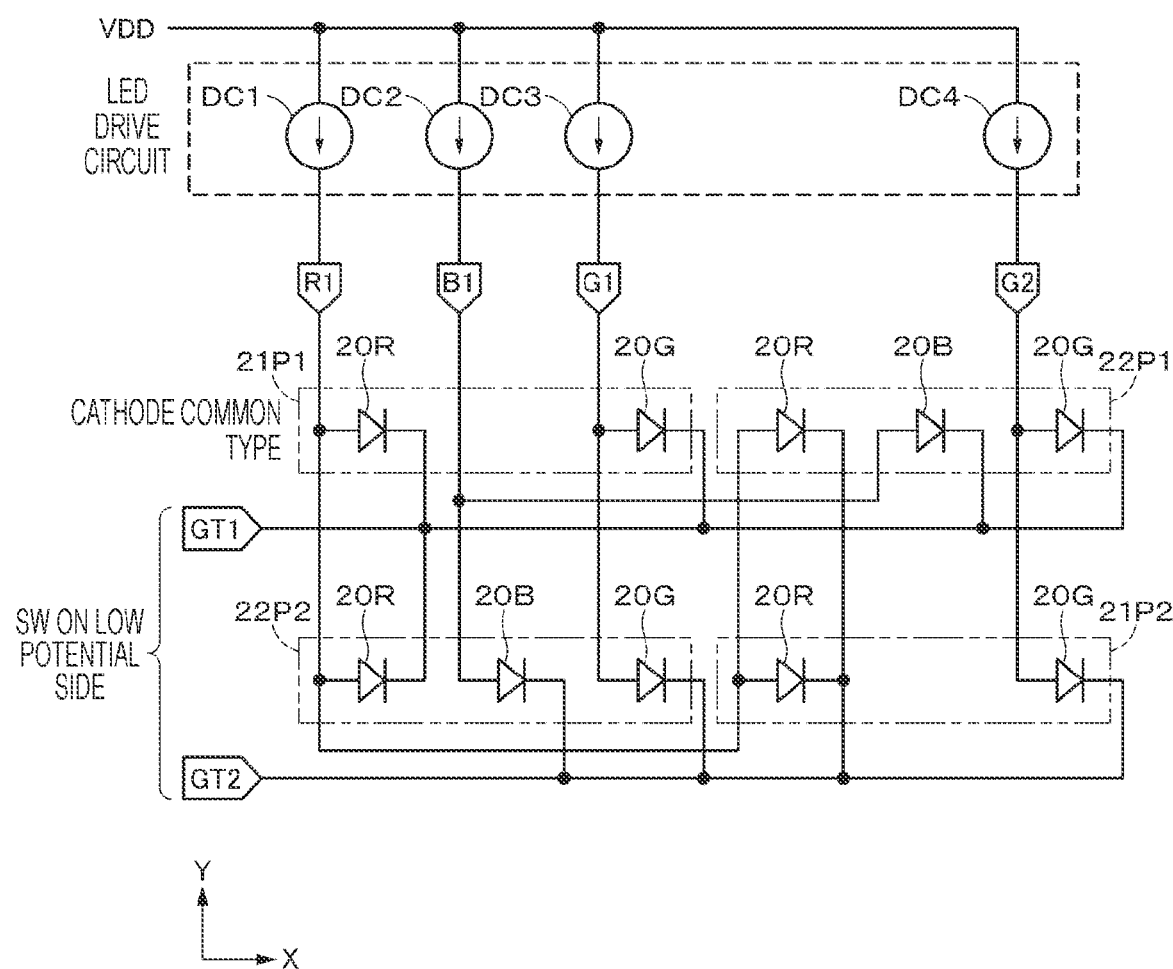
FIG. 7B is a circuit diagram of the surface mount device of the modification.

Since the SMD 12 has the above-described circuit configuration, as illustrated in FIGS. 7A and 7B, the anode terminal 24R2 (see FIG. 6A) and the signal line R2 (see FIG. 6B) can be omitted.

Modification 5

In the first embodiment, an example in which the SMD 12 is of a cathode common type in which the cathode is a common terminal has been described. However, the SMD 12 may be of an anode common type in which the anode is a common terminal. In an anode common type SMD 12, the gate (switch) is provided on the common anode side of each of LED elements 20R, 20G, and 20B, switching is performed on the power supply side (high potential side), and a current is drawn from each of the LED elements 20R, 20G, and 20B by a current source on the cathode side.

Figure 8A:
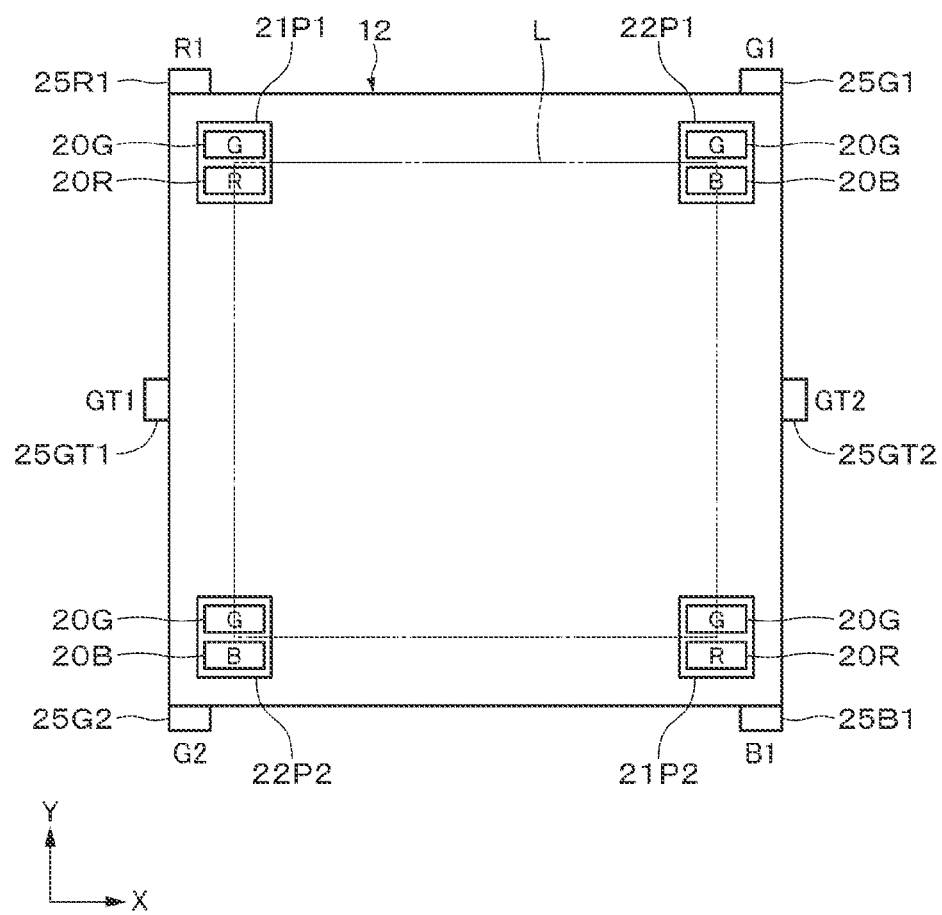
FIG. 8A is a plan view of a surface mount device of a modification.
Figure 8B:
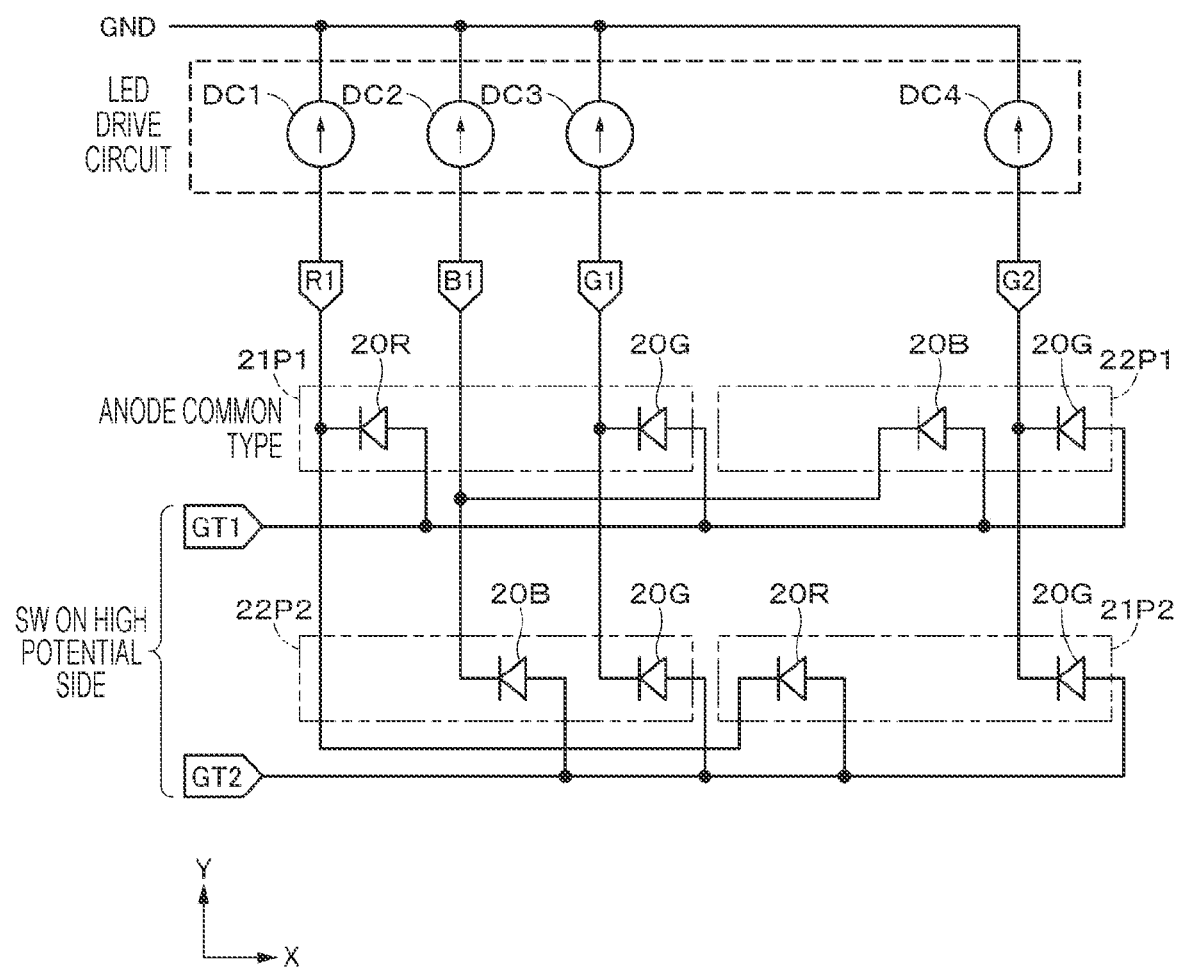
FIG. 8B is a circuit diagram of the surface mount device of the modification.

FIG. 8A is a plan view of an anode common type SMD 12. FIG. 8B is a circuit diagram of the anode common type SMD 12. The anode common type SMD 12 has anode terminals (gate terminals) 25GT1 and 25GT2 which are common terminals, a cathode terminal 25R1, cathode terminals 25G1 and G2, and a cathode terminal 25B1.

The anodes of the green LED element 20G and the red LED element 20R included in a pixel 21P1 and the anodes of the green LED element 20G and the blue LED element 20B included in a pixel 22P1 are connected to a scanning line GT1 via the common anode terminal 25GT1. The anodes of the green LED element 20G and the red LED element 20R included in a pixel 21P2 and the anodes of the green LED element 20G and the blue LED element 20B included in a pixel 22P2 are connected to a scanning line GT2 via the common anode terminal 25GT2.

The cathode of the green LED element 20G included in the pixel 21P1 and the cathode of the green LED element 20G included in the pixel 22P2 are connected to a signal line G1 via the cathode terminal 25G1. The green LED element 20G of the pixel 21P2 and the cathode of the green LED element 20G of the pixel 22P1 are connected to a signal line G2 via the cathode terminal 25G2.

The cathode of the red LED element 20R included in the pixel 21P1 and the cathode of the red LED element 20R included in the pixel 21P2 are connected to a signal line R1 via the cathode terminal 25R1.

The cathode of the blue LED element 20B included in the pixel 22P1 and the cathode of the blue LED element 20B included in the pixel 22P2 are connected to a signal line B1 via the cathode terminal 25B1.

The scanning lines GT1 and GT2 are connected to gates (not illustrated) as switches. The signal lines R1, B1, G1, and G2 are connected to DC sources DC1, DC2, DC3, and DC4, respectively.

Note that in Modifications 1 to 4, too, the SMD 12 may be an anode common type instead of the cathode common type.

Modification 6

In the first embodiment, an example has been described in which each of the plurality of SMDs 12 includes 2×2 of the pixels 21P1 and 21P2. However, each of the plurality of SMDs 12 may include n×m of the pixels 21P1 and 21P2 (where n and m are, for example, an integer of 1 or more, preferably an integer of 2 or more, n is the number of pixels in the X-axis direction, and m is the number of pixels in the Y-axis direction.). Note that the pixel arrangement in the first embodiment corresponds to an example in which each of the number n of pixels in the X-axis direction and the number m of pixels in the Y-axis direction is two.

2. Second Embodiment

Configuration of Display Device

Figure 9:
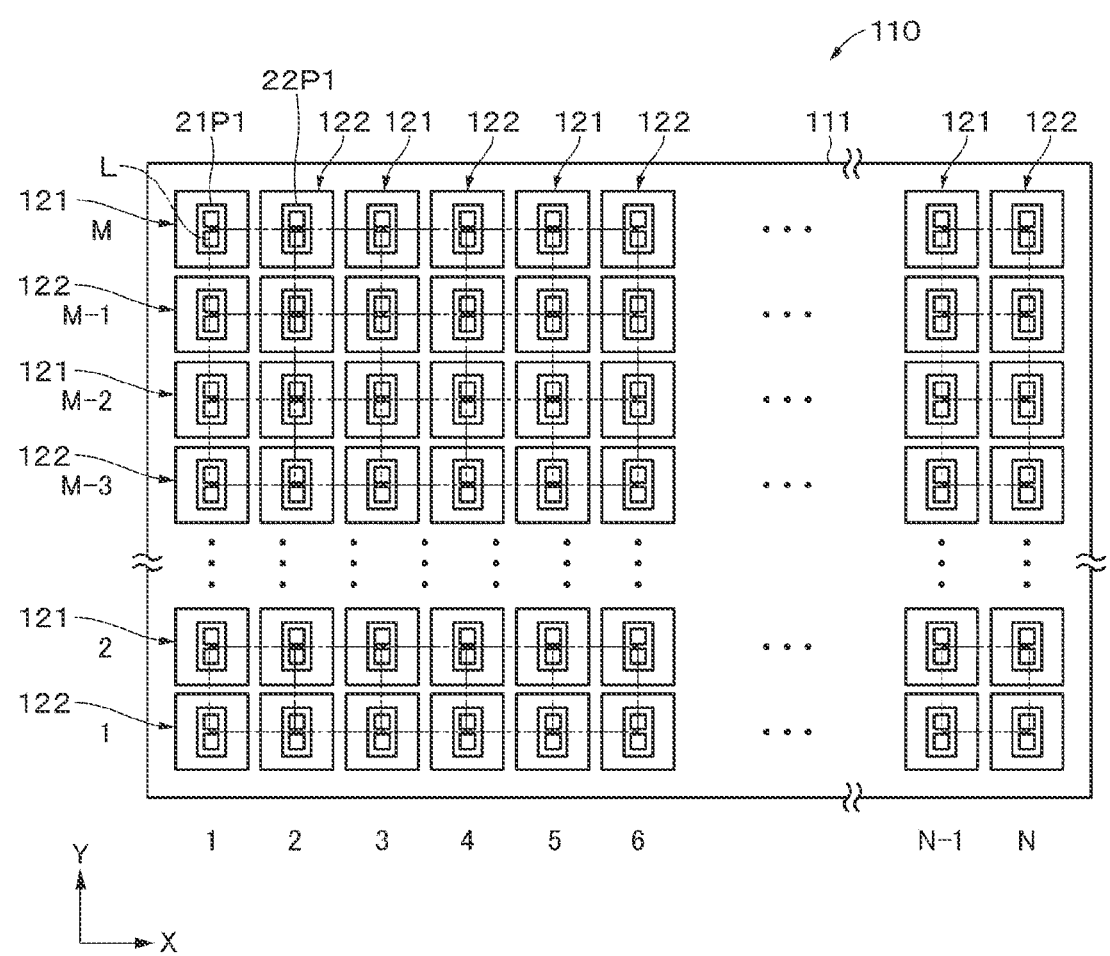
FIG. 9 is a plan view of a display device according to a second embodiment of the present disclosure.

FIG. 9 is a plan view of a display device 110 according to a second embodiment of the present disclosure. The display device 110 includes a substrate 111, and a plurality of SMDs 121 and a plurality of SMDs 122 provided on the substrate 111.

Substrate

The substrate 111 is similar to the substrate 11 in the first embodiment except that it includes a plurality of SMDs 121 and a plurality of signal lines, a plurality of scanning lines and driver ICs, and the like for controlling the plurality of SMDs 122.

SMD

The plurality of SMDs 121 and the plurality of SMDs 122 are two-dimensionally arranged in a lattice shape (matrix shape) such that the SMDs 121 and 122 are alternately arranged in the X-axis direction and alternately arranged in the Y-axis direction. The SMDs 121 and 122 are SMDs (1 in 1 SMD) in which one pixel is integrated into one chip. In the following description, the positions of the plurality of SMDs 121 and 122 two-dimensionally arranged in a lattice shape are represented by (N, M) (where N indicates the numbers of the columns of the SMDs 121 and 122, and M indicates the numbers of the rows of the SMDs 121 and 122.).

Figure 10A:
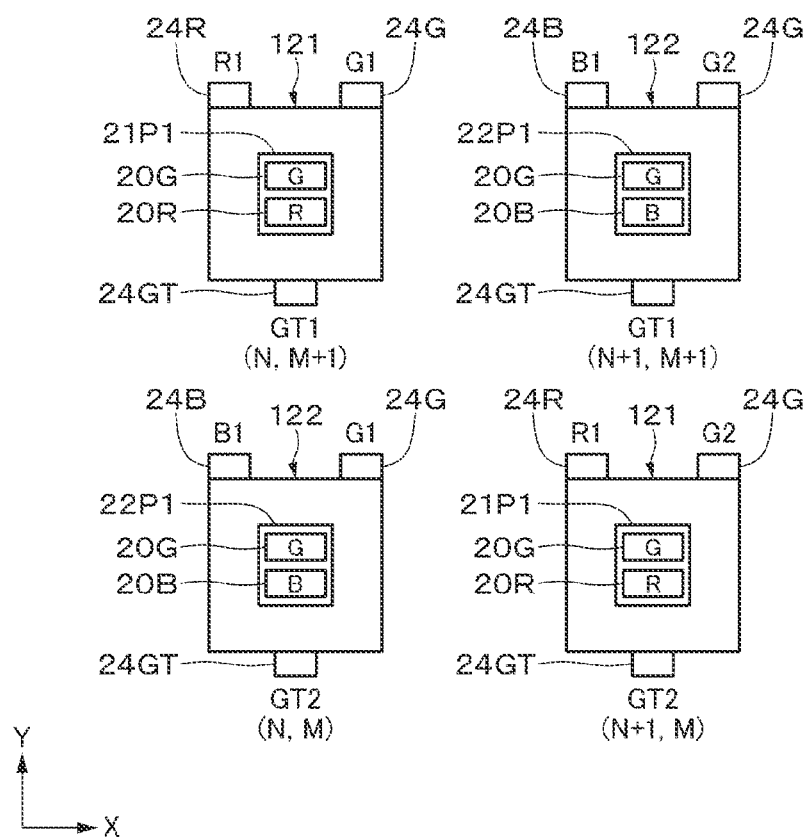
FIG. 10A is a plan view of a surface mount device.
Figure 10B:
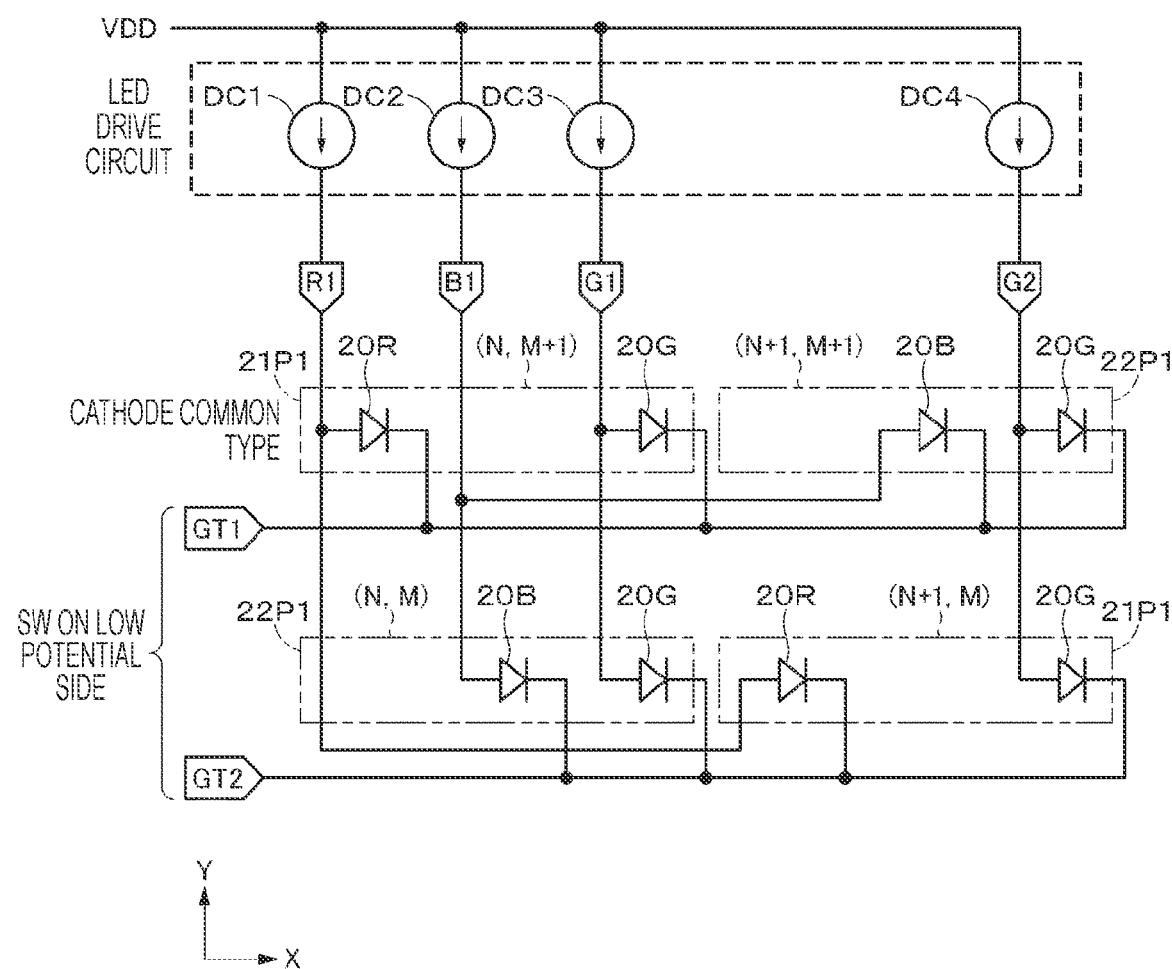
FIG. 10B is a circuit diagram of the surface mount device.

FIG. 10A is a plan view of the SMDs 121 and 122. FIG. 10B is a circuit diagram of the SMDs 121 and 122. The SMDs 121 and 122 are of a cathode common type in which the cathode is a common terminal. Each of the plurality of SMDs 121 includes one pixel (first pixel) 21P1. Each of the plurality of SMDs 122 includes one pixel (second pixel) 22P1. The SMD 121 includes a cathode terminal (gate terminal) 24GT, an anode terminal 24R, and an anode terminal 24G. The SMD 122 includes the cathode terminal (gate terminal) 24GT, an anode terminal 24B, and the anode terminal 24G.

The cathodes of a green LED element 20G and a red LED element 20R included in the SMD 121 (i.e., pixel 21P1) located at (N, M+1) are connected to a scanning line GT1 via the common cathode terminal 24GT. The cathodes of the green LED element 20G and a blue LED element 20B included in the SMD 122 (i.e., pixel 22P1) located at (N+1, M+1) are connected to the scanning line GT1 via the common cathode terminal 24GT.

The cathodes of the green LED element 20G and the red LED element 20R included in the SMD 121 (i.e., pixel 21P1) located at (N+1, M) are connected to a scanning line GT2 via the common cathode terminal 24GT. The cathodes of the green LED element 20G and the blue LED element 20B included in the SMD 122 (i.e., pixel 22P1) located at (N, M) are connected to the scanning line GT2 via the common cathode terminal 24GT.

The anode of the green LED element 20G included in the SMD 121 (i.e., pixel 21P1) located at (N, M+1) is connected to a signal line G1 via the anode terminal 24G. The anode of the red LED element 20R included in the SMD 121 (i.e., pixel 21P1) located at (N, M+1) is connected to a signal line R1 via the anode terminal 24R.

The anode of the green LED element 20G included in the SMD 122 (i.e., pixel 22P1) located at (N+1, M+1) is connected to a signal line G2 via the anode terminal 24G. The anode of the blue LED element 20B included in the SMD 122 (i.e., pixel 22P1) located at (N+1, M+1) is connected to a signal line B1 via the anode terminal 24B.

The anode of the green LED element 20G included in the SMD 121 (i.e., pixel 21P1) located at (N+1, M) is connected to the signal line G2 via the anode terminal 24G. The anode of the red LED element 20R included in the SMD 121 (i.e., pixel 21P1) located at (N+1, M) is connected to the signal line R1 via the anode terminal 24R.

The anode of the green LED element 20G included in the SMD 122 (i.e., pixel 22P1) located at (N, M) is connected to the signal line G1 via the anode terminal 24G. The anode of the blue LED element 20B included in the SMD 122 (i.e., pixel 22P1) located at (N, M) is connected to the signal line B1 via the anode terminal 24B.

Operation and Effect

As described above, the display device 110 according to the second embodiment includes the plurality of SMDs 121 each having one pixel 21P1 and the plurality of SMDs 122 each having one pixel 22P1, and the SMDs 121 and 122 are alternately arranged in the X-axis direction and alternately arranged in the Y-axis direction. Therefore, an operation and effect similar to that of the display device 10 according to the first embodiment can be obtained.

Modification

Modification 1

The above second embodiment describes an example in which the display device 110 includes the four pixels 21P1, 21P2, 22P1, and 22P2, which are included in one SMD 12 (see FIG. 2A) in the first embodiment, in four separate SMDs 121 and 122. Similarly, the four pixels 21P1, 21P2, 22P1, and 22P2 included in one SMD 12 in Modification 1, Modification 2, Modification 3, or Modification 4 of the first embodiment may be included in four separate SMDs 121 and 122.

Modification 2

In the second embodiment, an example in which the SMDs 121 and 122 are of the cathode common type has been described. However, the SMDs 121 and 122 may be of an anode common type.

3. Third Embodiment

Figure 11:
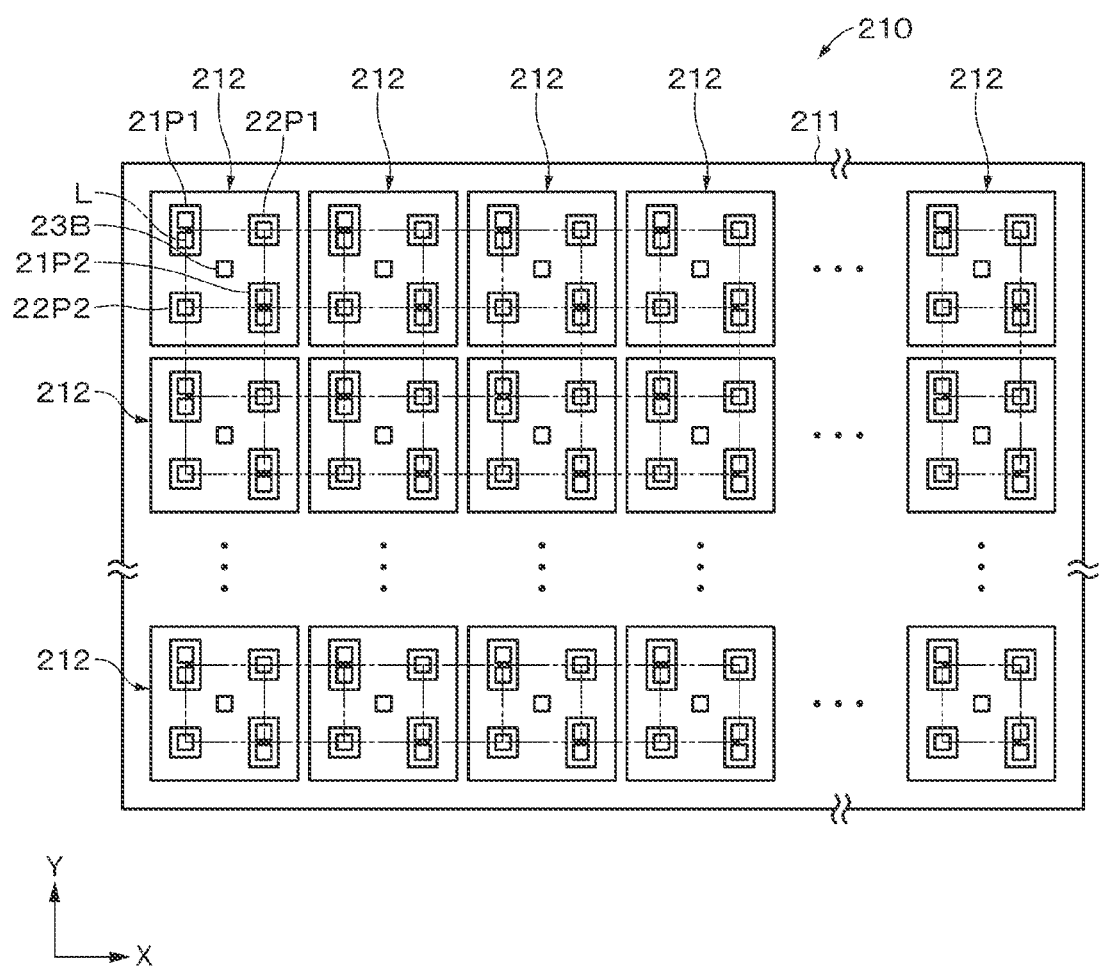
FIG. 11 is a plan view of a display device according to a third embodiment of the present disclosure.

FIG. 11 is a plan view of a display device 210 according to a third embodiment of the present disclosure. The display device 210 includes a substrate 211 and a plurality of SMDs 212 provided on the substrate 211.

Substrate

The substrate 211 is similar to the substrate 11 in the first embodiment except that it includes a plurality of signal lines, a plurality of scanning lines and driver ICs, and the like for controlling the plurality of SMDs 212.

SMD

Figure 12A:
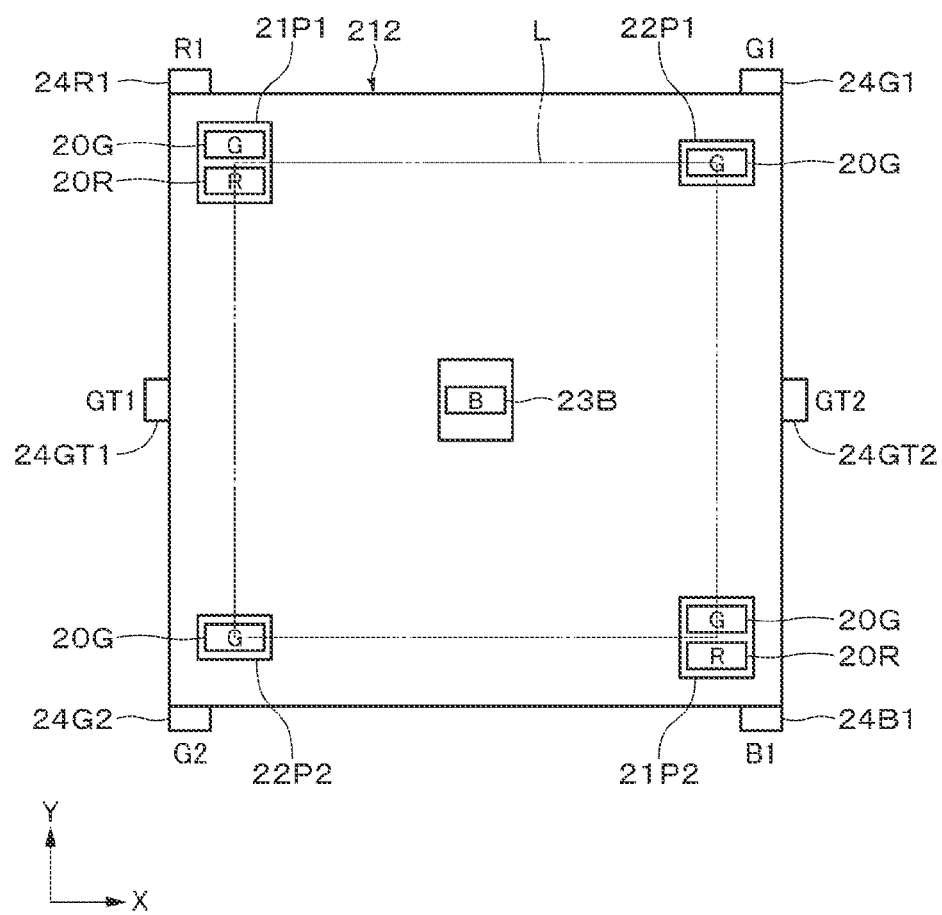
FIG. 12A is a plan view of a surface mount device.
Figure 12B:
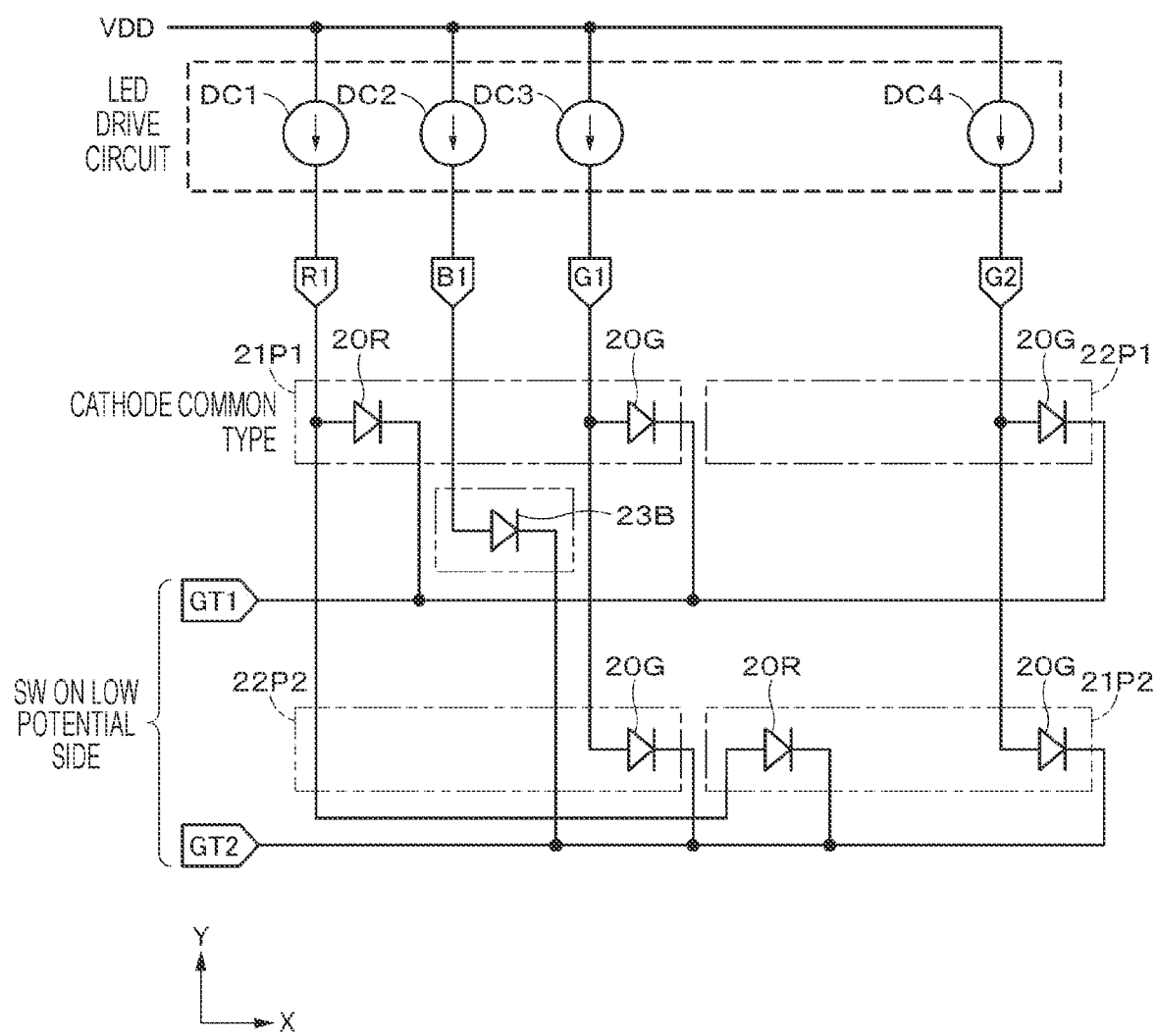
FIG. 12B is a circuit diagram of the surface mount device.

FIG. 12A is a plan view of the SMD 212. FIG. 12B is a circuit diagram of the SMD 112. The SMD 212 is different from the SMD 12 in the first embodiment in that each of a pixel 22P1 and a pixel 22P2 includes only a green LED element 20G, and that the SMD 212 further includes a blue LED 23B arranged in a central part of a basic lattice L. The anode of the blue LED 23B is connected to a signal line B1, and the cathode of the blue LED 23B is connected to a scanning line GT2.

The display device 210 according to the third embodiment is similar to the display device 10 according to the first embodiment in points other than the above.

Operation and Effect

As described above, in the display device 210 according to the third embodiment, instead of providing the blue LED element 20B to each of the pixels 22P1 and 22P2, the blue LED 23B is arranged in the central part of the basic lattice L. As a result, the number of blue LED elements 20B can be reduced as compared with the display device 10 according to the first embodiment. Therefore, the display device 210 can be reduced in cost.

Modification

Modification 1

Figure 13A:
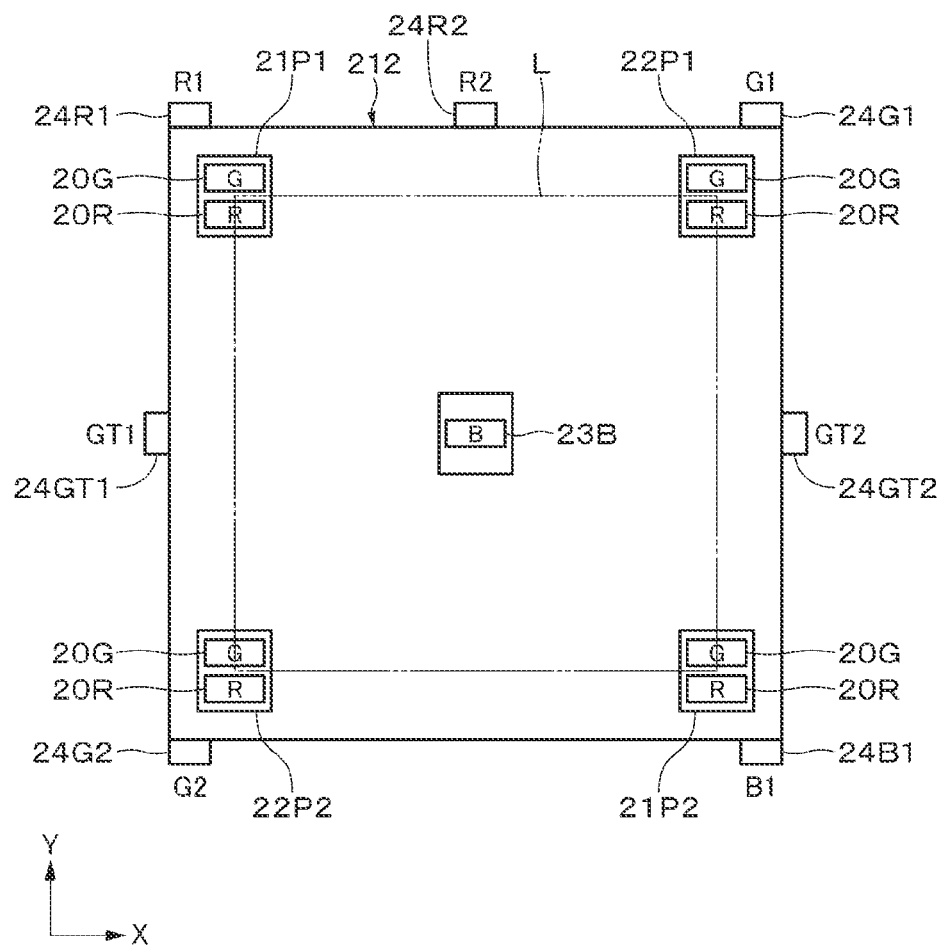
FIG. 13A is a plan view of a surface mount device of a modification.

In the above-described third embodiment, an example in which the pixel 22P1 and the pixel 22P2 of the SMD 212 each include only the green LED element 20G has been described. However, as illustrated in FIG. 13A, each of a pixel 22P1 and a pixel 22P2 may further include a red LED element 20R.

Figure 13B:
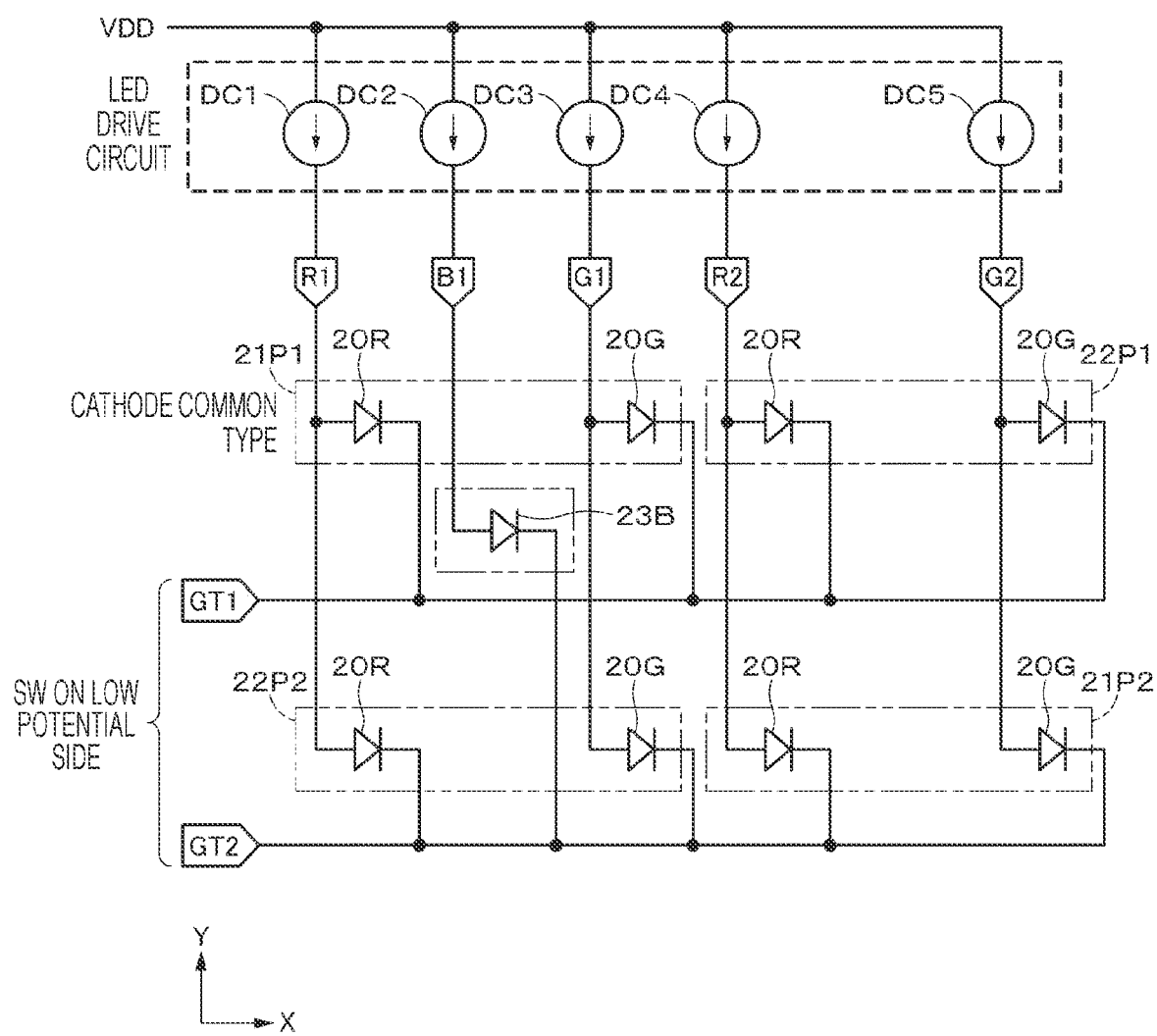
FIG. 13B is a circuit diagram of a surface mount device of a modification.

In a case where an SMD 212 has the above-described pixel configuration, as illustrated in FIG. 13B, the anode of the red LED element 20R included in the pixel 22P1 may be connected to a signal line R2 via an anode terminal 24R2, and the cathode of the red LED element 20R may be connected to a scanning line GT1 via a cathode terminal 24GT1. The anode of the red LED element 20R included in the pixel 22P2 may be connected to a signal line R1 via an anode terminal 24R1, and the cathode of the red LED element 20R may be connected to a scanning line GT2 via a cathode terminal 24GT2.

Figure 13C:
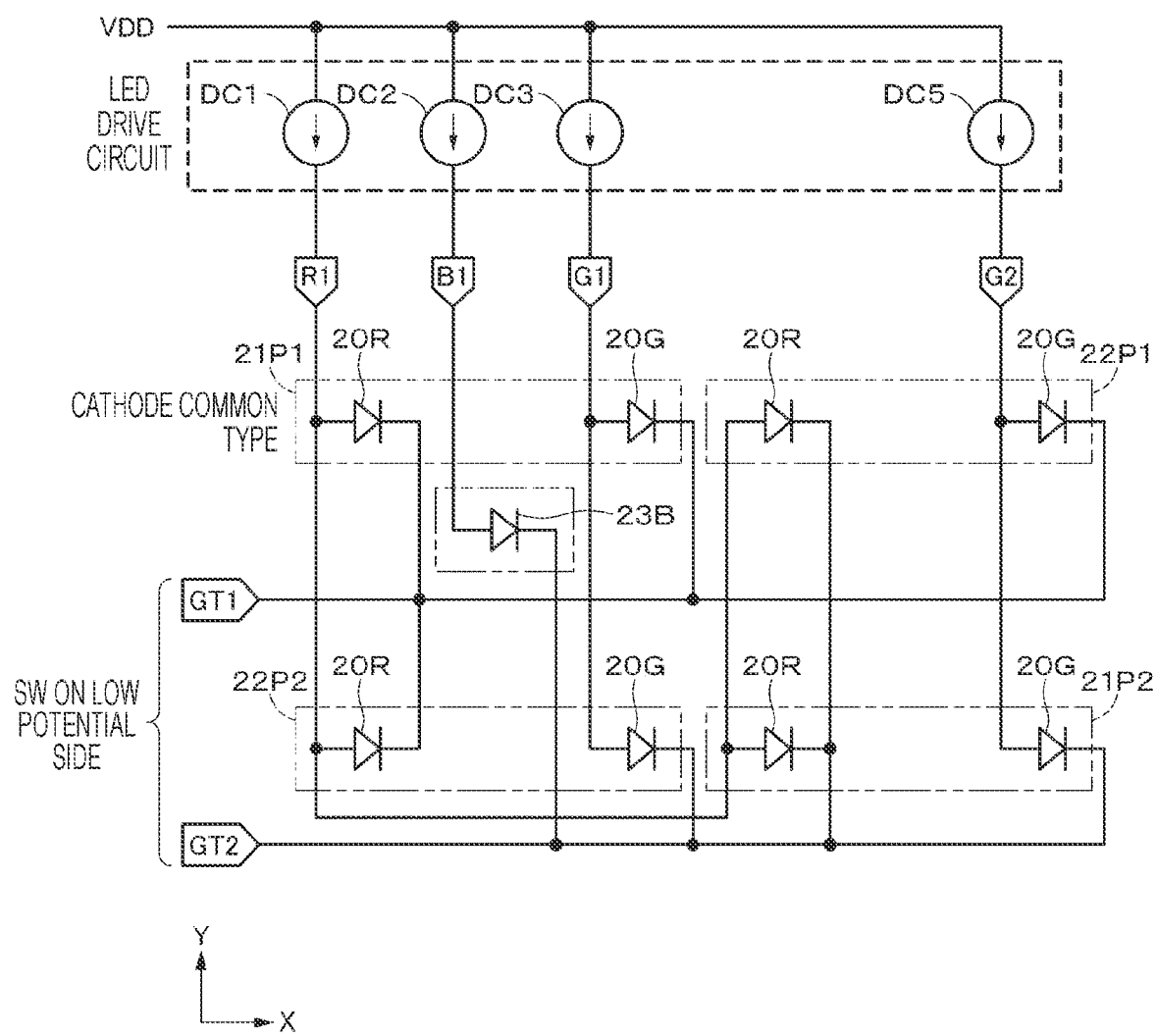
FIG. 13C is a circuit diagram of a surface mount device of a modification.

The SMD 212 may have a circuit configuration different from the above-described circuit configuration (FIG. 13B). For example, as illustrated in FIG. 13C, in the SMD 212, the red LED elements 20R included in the pixels 21P1 and 22P2 adjacent in the Y-axis direction may be connected in parallel between the signal line R1 and the scanning line GT1. Specifically, the anodes of the red LED elements 20R included in the pixels 21P1 and 22P2 adjacent in the Y-axis direction may both be connected to the signal line R1 via an anode terminal 24R1, and the cathodes of the red LED elements 20R may both be connected to the scanning line GT1 via the cathode terminal 24GT1.

Similarly, the red LED elements 20R included in the pixels 22P1 and 21P2 adjacent in the Y-axis direction may be connected in parallel between the signal line R1 and the scanning line GT2. Specifically, the anodes of the red LED elements 20R included in the pixels 22P1 and 21P2 adjacent in the Y-axis direction may both be connected to the signal line R1 via the anode terminal 24R1, and the cathodes of the red LED elements 20R may both be connected to the scanning line GT2 via the cathode terminal 24GT2.

Since the SMD 212 has the above-described circuit configuration, the anode terminal 24R2 (see FIG. 13A) and the signal line R2 (see FIG. 13B) can be omitted.

Modification 2

In the above-described first to third embodiments, an example in which the display devices 10, 110, and 210 include the plurality of SMDs 12, 121, 122, and 212 having the plurality of LED elements 20R, 20B, and 20G has been described. However, instead of the plurality of SMDs 12, 121, 122, and 212, a plurality of chip on boards (COBs) or glue on boards (GOBs) having the plurality of LED elements 20R, 20B, and 20G may be included. A GOB includes a protective layer covering a plurality of pixels 21P and a plurality of pixels 22P on a display surface. The protective layer includes a resin layer or a film, for example.

Modification 3

In the above-described first to third embodiments, an example in which the plurality of SMDs 12, 121, 122, and 212 is secondarily arranged on the substrate has been described. However, the plurality of pixels 21P and the plurality of pixels 22P may be two-dimensionally arranged directly on the substrates 11, 111, and 211. In this case, the plurality of LED elements 20R, 20B, and 20G may be embedded in the substrates 11, 111, and 211. The LED elements 20R, 20B, and 20G may be micro LED elements.

Modification 4

In the first to third embodiments described above, an example has been described in which the pixels 21P1, 21P2, 22P1, and 22P2 (hereinafter referred to as pixel 21P1 and the like) include the red LED element 20R, the green LED element 20G, the blue LED element 20B, and the yellow LED element 20Y as light emitting units. However, the light emitting units are not limited thereto. For example, the pixel 21P1 and the like may include, instead of the red LED element 20R, a white LED element 20W and a red filter provided on the white LED element 20W, and include a red light emitting unit capable of emitting red light. The pixel 21P1 and the like may include, instead of the green LED element 20G, a white LED element 20W and a green filter provided on the white LED element 20W, and include a green light emitting unit capable of emitting green light. The pixel 21P1 and the like may include, instead of the blue LED element 20B, a white LED element 20W and a blue filter provided on the white LED element 20W, and include a blue light emitting unit capable of emitting blue light. The pixel 21P1 and the like may include, instead of the yellow LED element 20Y, a white LED element 20W and a yellow filter provided on the white LED element 20W, and include a yellow light emitting unit capable of emitting yellow light.

Furthermore, in the third embodiment, instead of the blue LED 23B, the SMD 212 may include a white LED element 20W and a blue filter provided on the white LED element 20W, and include a blue light emitting unit capable of emitting blue light.

Furthermore, a light emitting unit may have the following configuration. For example, the pixel 21P1 and the like may include a blue LED and a red light emitting element by quantum dot (QD) color conversion instead of the red LED element 20R. The pixel 21P1 and the like may include a blue LED and a green light emitting element by quantum dot (QD) color conversion instead of the green LED element 20G. The pixel 21P1 and the like may include a blue LED and a yellow light emitting element by quantum dot (QD) color conversion instead of the yellow LED element 20Y.

While embodiments and modifications of the present disclosure have been specifically described above, the present disclosure is not limited to the above-described embodiments and modifications, and various modifications based on the technical idea of the present disclosure are possible.

For example, the configurations, methods, shapes, and the like described in the above embodiments and modifications are merely examples, and different configurations, methods, shapes, and the like may be used as necessary.

The configurations, methods, shapes, and the like of the above-described embodiments and modifications can be combined with each other without departing from the gist of the present disclosure.

Furthermore, the present disclosure can adopt the following configurations.

(1)

A display device including:

a plurality of first pixels each having a first light emitting diode element and a second light emitting diode element having different colors; and a plurality of second pixels each having a third light emitting diode element and a fourth light emitting diode element having different colors, in which the first pixels and the second pixels have different combinations of colors of light emitting diode elements, the first light emitting diode element is a green light emitting diode element, the third light emitting diode element is a green light emitting diode element, a yellow light emitting diode element, or a white light emitting diode element, and the first pixels and the second pixels are alternately arranged in a first direction and are alternately arranged in a second direction intersecting the first direction.

(2)

The display device according to (1), in which the second light emitting diode element is a red light emitting diode element, the third light emitting diode element is the green light emitting diode element, and the fourth light emitting diode element is a blue light emitting diode element.

(3)

The display device according to (1), in which the second light emitting diode element is a red light emitting diode element, the third light emitting diode element is the yellow light emitting diode element, and the fourth light emitting diode element is a blue light emitting diode element.

(4)

The display device according to (1), in which the second light emitting diode element is a red light emitting diode element, the third light emitting diode element is the white light emitting diode element, and the fourth light emitting diode element is a blue light emitting diode element.

(5)

The display device according to (1), in which the second pixel further includes a fifth light emitting diode element, the second light emitting diode element is a red light emitting diode element, the third light emitting diode element is the green light emitting diode element, the fourth light emitting diode element is a blue light emitting diode element, and the fifth light emitting diode element is a red light emitting diode element.

(6)

The display device according to (5), in which the red light emitting diode elements that are included in the first pixel and the second pixel adjacent to each other in the second direction are connected in parallel.

(7)

The display device according to any one of (1) to (6), further including a plurality of surface mount devices, in which each of the plurality of surface mount devices has n×m first pixels and n×m second pixels (where n is the number of pixels in the first direction, and m is the number of pixels in the second direction).

(8)

The display device according to (7), in which the number n of pixels in the first direction is two and the number m of pixels in the second direction is two.

(9)

The display device according to any one of (1) to (6), further including:

a plurality of first surface mount devices; and a plurality of second surface mount devices, in which each of the plurality of first surface mount devices includes one first pixel, each of the plurality of second surface mount devices includes one second pixel, and the first surface mount devices and the second surface mount devices are alternately arranged in the first direction and are alternately arranged in the second direction.

(10)

The display device according to any one of (1) to (6), further including a substrate, in which
   a plurality of the first pixels and a plurality of the second pixels are two-dimensionally arranged directly on the substrate.

(11)

The display device according to any one of (1) to (10), further including a protective layer that covers a plurality of the first pixels and a plurality of the second pixels.

(12)

A display device including:
a plurality of first pixels each having a green light emitting diode element and a red light emitting diode element;
a plurality of second pixels each having a green light emitting diode element; and
a blue light emitting diode element, in which
   the first pixels and the second pixels are arranged in a lattice shape so as to be alternately arranged in a first direction and alternately arranged in a second direction intersecting the first direction, and
   the blue light emitting diode element is arranged in a central part of a basic lattice in the arrangement in a lattice shape.

The display device according to (12), in which each of the second pixels further includes a red light emitting diode element.

(14)

A display device including:
a first pixel including a first light emitting unit and a second light emitting unit having different colors; and
a second pixel including a third light emitting unit and a fourth light emitting unit having different colors, in which
   the first pixel and the second pixel have different combinations of colors of light emitting units,
   the first light emitting unit is a green light emitting unit including a white light emitting diode and a green filter,
   the third light emitting unit is a green light emitting unit including a white light emitting diode and a green filter, a yellow light emitting unit including a white light emitting diode and a yellow filter, or a white light emitting unit including a white light emitting diode, and
   the first pixel and the second pixel are alternately arranged in a first direction and are alternately arranged in a second direction intersecting the first direction.

(15)

The display device according to (14), in which
the second light emitting unit is a red light emitting unit including a white light emitting diode and a red filter,
the third light emitting unit is the green light emitting unit, and
the fourth light emitting unit is a blue light emitting unit including a white light emitting diode and a blue filter.

(16)

The display device according to (14), in which
the second light emitting unit is a red light emitting unit including a white light emitting diode and a red filter,
the third light emitting unit is the yellow light emitting unit, and
the fourth light emitting unit is a blue light emitting unit including a white light emitting diode and a blue filter.

(17)

The display device according to (14), in which
the second light emitting unit is a red light emitting unit including a white light emitting diode and a red filter, the third light emitting unit is the white light emitting unit, and
the fourth light emitting unit is a blue light emitting unit including a white light emitting diode and a blue filter.

(18)

The display device according to (14), in which
the second pixel further includes a fifth light emitting unit,
the second light emitting unit is a red light emitting unit including a white light emitting diode and a red filter,
the third light emitting unit is the green light emitting unit,
the fourth light emitting unit is a green light emitting unit including a white light emitting diode and a blue filter, and
the fifth light emitting unit is a blue light emitting unit including a white light emitting diode and a red filter.

(19)

A display device including:
a plurality of first pixels each including a green light emitting unit and a red light emitting unit;
a plurality of second pixels each including a green light emitting unit; and
a blue light emitting unit, in which
the green light emitting unit included in the first pixel and the green light emitting unit included in the second pixel include a white light emitting diode and a green filter,
the red light emitting unit includes a white light emitting diode and a red filter,
the blue light emitting unit includes a white light emitting diode and a blue filter,
the first pixels and the second pixels are arranged in a lattice shape so as to be alternately arranged in a first direction and alternately arranged in a second direction intersecting the first direction, and
the blue light emitting unit is arranged in a central part of a basic lattice in the arrangement in a lattice shape.

(20)

The display device according to (19), in which
the second pixel further includes a red light emitting unit, and
the red light emitting unit included in the second pixel includes a white light emitting diode and a red filter.

REFERENCE SIGNS LIST 10, 110, 210 Display device
11, 111, 211 Substrate
12, 32, 121, 122, 212 SMD
20R Red LED element
20G Green LED element
20B Blue LED element
20Y Yellow LED element
20W White LED element
21P1, 21P2 Pixel (first pixel)
22P1, 22P2 Pixel (second pixel)
23B Blue LED element
24R, 24G, 24B Anode terminal
24GT Cathode terminal
24R1, 24R2, 24G1, 24G2, 24B1, 24B2, 24Y1, 24W1 Anode terminal
24GT1, 24GT2 Cathode terminal
25R1, 25G1, 25G2, 25B1 Cathode terminal
25GT1, 25GT2 Anode terminal
R1, R2, G1, G2, B1, B2, Y1, W1 Signal line
GT1, GT2 Scanning line
DC1, DC2, DC3, DC4, DC5, DC6 DC source

What is claimed is:

1. A display device, comprising:
a plurality of first surface mount devices;
a plurality of second surface mount devices;
a plurality of first pixels each having a first light emitting diode element and a second light emitting diode element having different colors; and
a plurality of second pixels each having a third light emitting diode element and a fourth light emitting diode element having different colors, wherein
each of the plurality of first surface mount devices includes one first pixel,
each of the plurality of second surface mount devices includes one second pixel,
the first surface mount devices and the second surface mount devices are alternately arranged in a first direction and are alternately arranged in a second direction intersecting the first direction,
the first pixels and the second pixels have different combinations of colors of light emitting diode elements,
the first light emitting diode element is a green light emitting diode element,
the third light emitting diode element is a green light emitting diode element, a yellow light emitting diode element, or a white light emitting diode element, and
the first pixels and the second pixels are alternately arranged in the first direction and are alternately arranged in the second direction intersecting the first direction.

2. The display device according to claim 1, wherein
the second light emitting diode element is a red light emitting diode element,
the third light emitting diode element is the green light emitting diode element, and
the fourth light emitting diode element is a blue light emitting diode element.

3. The display device according to claim 1, wherein
the second light emitting diode element is a red light emitting diode element,
the third light emitting diode element is the yellow light emitting diode element, and
the fourth light emitting diode element is a blue light emitting diode element.

4. The display device according to claim 1, wherein
the second light emitting diode element is a red light emitting diode element,
the third light emitting diode element is the white light emitting diode element, and
the fourth light emitting diode element is a blue light emitting diode element.

5. The display device according to claim 1, wherein
the second pixel further includes a fifth light emitting diode element,
the second light emitting diode element is a red light emitting diode element,
the third light emitting diode element is the green light emitting diode element,
the fourth light emitting diode element is a blue light emitting diode element, and
the fifth light emitting diode element is a red light emitting diode element.

6. The display device according to claim 5, wherein the red light emitting diode elements that are included in the first pixel and the second pixel adjacent to each other in the second direction are connected in parallel.

7. The display device according to claim 1, further comprising a protective layer that covers a plurality of the first pixels and a plurality of the second pixels.

8. A display device, comprising:
a plurality of first surface mount devices;
a plurality of second surface mount devices;
a plurality of first pixels each having a green light emitting diode element and a red light emitting diode element;
a plurality of second pixels each having a green light emitting diode element; and a blue light emitting diode element, wherein
each of the plurality of first surface mount devices includes one first pixel,
each of the plurality of second surface mount devices includes one second pixel,
the first surface mount devices and the second surface mount devices are alternately arranged in a first direction and are alternately arranged in a second direction intersecting the first direction such that the first pixels and the second pixels are arranged in a lattice shape so as to be alternately arranged in the first direction and alternately arranged in the second direction intersecting the first direction, and
the blue light emitting diode element is arranged in a central part of a basic lattice in the arrangement in a lattice shape.

9. The display device according to claim 8, wherein each of the second pixels further includes a red light emitting diode element.

10. A display device, comprising:
a plurality of first surface mount devices;
a plurality of second surface mount devices;
a first pixel including a first light emitting unit and a second light emitting unit having different colors; and
a second pixel including a third light emitting unit and a fourth light emitting unit having different colors, wherein
each of the plurality of first surface mount devices includes one first pixel,
each of the plurality of second surface mount devices includes one second pixel,
the first pixel and the second pixel have different combinations of colors of light emitting units,
the first light emitting unit is a green light emitting unit including a white light emitting diode and a green filter,
the third light emitting unit is a green light emitting unit including a white light emitting diode and a green filter, a yellow light emitting unit including a white light emitting diode and a yellow filter, or a white light emitting unit including a white light emitting diode, and
the first surface mount devices and the second surface mount devices are alternately arranged in a first direction and are alternately arranged in a second direction intersecting the first direction such that the first pixel and the second pixel are alternately arranged in the first direction and are alternately arranged in the second direction intersecting the first direction.

11. The display device according to claim 10, wherein
the second light emitting unit is a red light emitting unit including a white light emitting diode and a red filter,
the third light emitting unit is the green light emitting unit, and
the fourth light emitting unit is a blue light emitting unit including a white light emitting diode and a blue filter.

12. The display device according to claim 10, wherein
the second light emitting unit is a red light emitting unit including a white light emitting diode and a red filter,
the third light emitting unit is the yellow light emitting unit, and
the fourth light emitting unit is a blue light emitting unit including a white light emitting diode and a blue filter.

13. The display device according to claim 10, wherein
the second light emitting unit is a red light emitting unit including a white light emitting diode and a red filter,
the third light emitting unit is the white light emitting unit, and
the fourth light emitting unit is a blue light emitting unit including a white light emitting diode and a blue filter.

14. The display device according to claim 10, wherein
the second pixel further includes a fifth light emitting unit,
the second light emitting unit is a red light emitting unit including a white light emitting diode and a red filter,
the third light emitting unit is the green light emitting unit,
the fourth light emitting unit is a blue light emitting unit including a white light emitting diode and a blue filter, and
the fifth light emitting unit is a red light emitting unit including a white light emitting diode and a red filter.

15. A display device, comprising:
a plurality of first surface mount devices;
a plurality of second surface mount devices;
a plurality of first pixels each including a green light emitting unit and a red light emitting unit;
a plurality of second pixels each including a green light emitting unit; and
a blue light emitting unit, wherein
the green light emitting unit included in the first pixel and the green light emitting unit included in the second pixel include a white light emitting diode and a green filter,
the red light emitting unit includes a white light emitting diode and a red filter,
the blue light emitting unit includes a white light emitting diode and a blue filter,
each of the plurality of first surface mount devices includes one first pixel,
each of the plurality of second surface mount devices includes one second pixel,
the first surface mount devices and the second surface mount devices are alternately arranged in a first direction and are alternately arranged in a second direction intersecting the first direction such that the first pixels and the second pixels are arranged in a lattice shape so as to be alternately arranged in the first direction and alternately arranged in the second direction intersecting the first direction, and
the blue light emitting unit is arranged in a central part of a basic lattice in the arrangement in a lattice shape.

16. The display device according to claim 15, wherein
the second pixel further includes a red light emitting unit, and
the red light emitting unit included in the second pixel includes a white light emitting diode and a red filter.

* * * * *